United States Patent
Nobukata

(10) Patent No.: US 7,450,451 B2
(45) Date of Patent: Nov. 11, 2008

(54) NONVOLATILE MEMORY SYSTEM AND METHOD FOR CONTROLLING NONVOLATILE MEMORY

(75) Inventor: Hiromi Nobukata, Kanagawa (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 11/712,627

(22) Filed: Mar. 1, 2007

(65) Prior Publication Data
US 2007/0217274 A1 Sep. 20, 2007

(30) Foreign Application Priority Data
Mar. 3, 2006 (JP) .............................. 2006-058549

(51) Int. Cl.
*G11C 7/00* (2006.01)
(52) U.S. Cl. .............. 365/201; 365/189.07; 365/189.09
(58) Field of Classification Search ................. 365/201, 365/189.07, 189.09
See application file for complete search history.

(56) References Cited
U.S. PATENT DOCUMENTS 5,745,414 A * 4/1998 Engh et al. ............... 365/185.2
5,754,470 A * 5/1998 Engh et al. ............. 365/185.03
6,134,148 A * 10/2000 Kawahara et al. ...... 365/185.28

* cited by examiner

*Primary Examiner*—Tuan T. Nguyen
(74) *Attorney, Agent, or Firm*—Frommer Lawrence & Haug LLP; William S. Frommer

(57) ABSTRACT

A nonvolatile memory system includes a drive voltage generator to generate a drive voltage on the basis of a power supply voltage; a plurality of normal memory cells serving as a nonvolatile memory storing data by accumulating charge of a polarity according to the data to be stored in a floating gate at a level according to the drive voltage generated by the drive voltage generator, the data being written in or read from the nonvolatile memory; a minimum voltage detecting memory cell serving as a nonvolatile memory in which charge of a level to cause a read error when the power supply voltage is equal to or lower than a minimum voltage of predetermined operation guarantee is accumulated in a floating gate; and a controller to output a read result of the normal memory cells if no read error occurs in a reading operation in the minimum voltage detecting memory cell.

8 Claims, 21 Drawing Sheets

FIG. 20
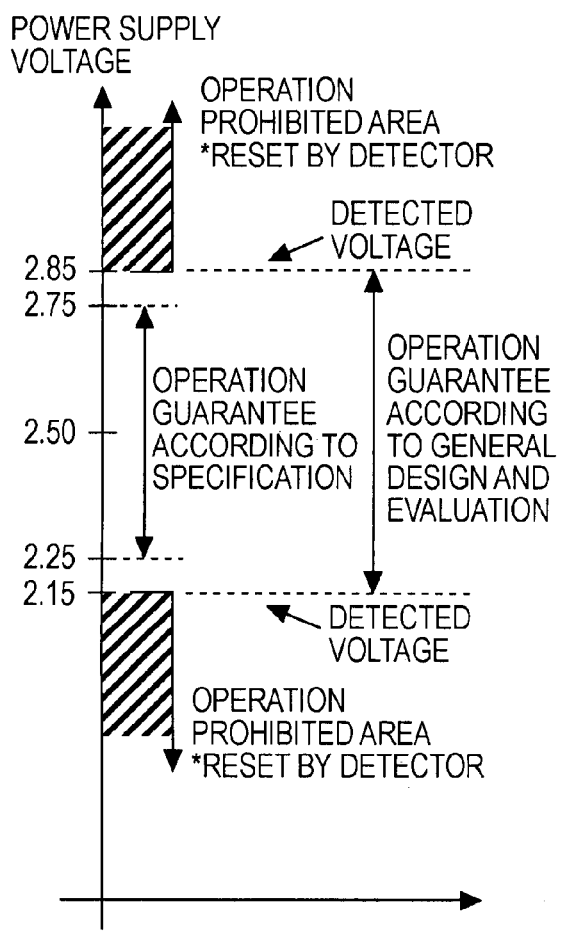
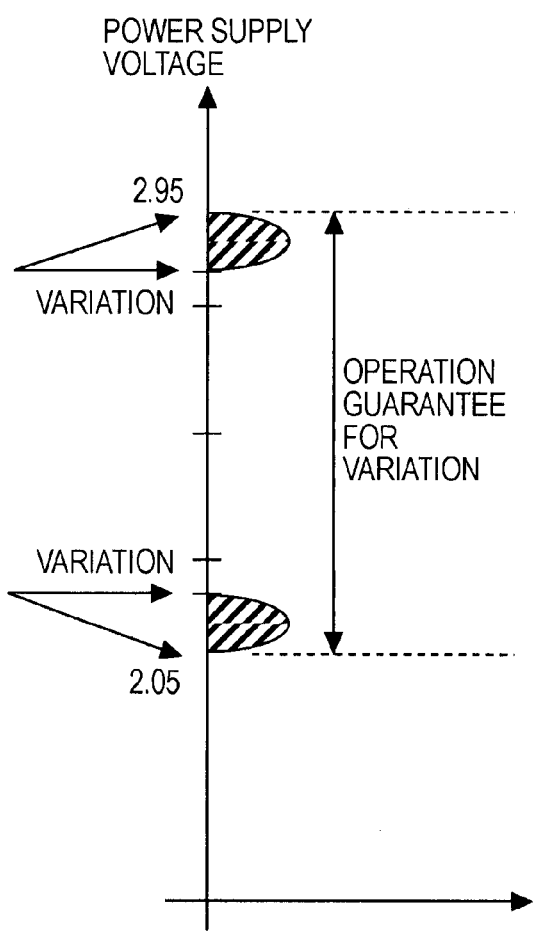
(a) DESIGN VALUE
(b) CONSIDER VARIATION

FIG. 21
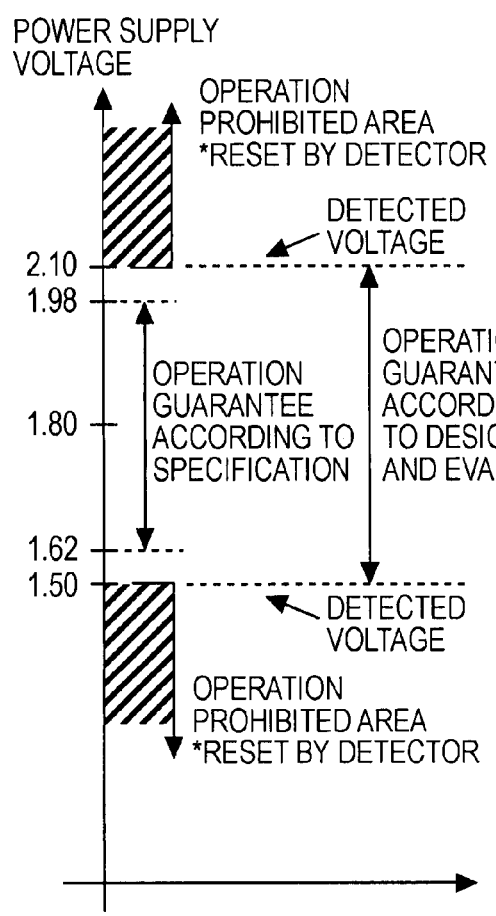
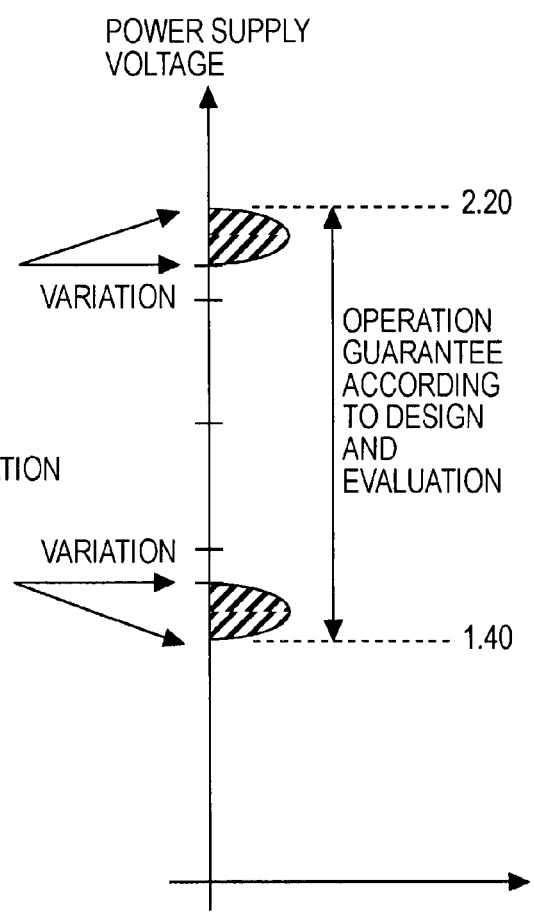
(a) DESIGN VALUE
(b) CONSIDER VARIATION

NONVOLATILE MEMORY SYSTEM AND METHOD FOR CONTROLLING NONVOLATILE MEMORY

CROSS REFERENCES TO RELATED APPLICATIONS

The present invention contains subject matter related to Japanese Patent Application JP 2006-058549 filed in the Japanese Patent Office on Mar. 3, 2006, the entire contents of which are incorporated herein by reference.

BACKGROUND OF THE INVENTION

1. Field of the Invention

The present invention relates to a nonvolatile memory system and a method for controlling a nonvolatile memory for prohibiting a reading operation under an improper environment.

2. Description of the Related Art

For example, in a security LSI (large scale integration) such as an IC (integrated circuit) card, data is transmitted to or received from another apparatus with the data being encrypted. Thus, an encrypting engine is mounted in the LSI, and a nonvolatile memory is also mounted therein in order to store secret information including a key in many cases. The security LSI can be attacked in various methods by an attacker who tries to illegally obtain secret information. The methods used by the attacker include the followings.

(1) Operate the security LSI under an operation environment (including voltage and clock frequency) outside a range defined by the specification in order to cause a malfunction, and extract secret information (encryption key or the like) by analyzing a result obtained through the malfunction.

(2) Obtain a consumption current waveform while an encrypting engine is operated with a plurality of input values, and extract an encryption key by performing a statistical process on the current waveform (DPA attack: differential power analysis).

(3) Open the LSI and cause a malfunction by using laser irradiation while the encrypting engine is operated, and extract an encryption key by analyzing the result (DFA attack: differential fault analysis).

The LSI is provided with countermeasures against the respective methods.

Against the methods (2) and (3), a countermeasure is mounted on a logic circuit of the encrypting engine or around the encrypting engine.

Against the method (1), a voltage detector or a frequency detector is mounted. If a voltage or a frequency outside a defined range is input, the detector outputs a detection signal and the system side performs reset in response to the detection signal.

Recently, some products have been provided with a temperature detector for an attack outside a defined temperature range, as well as the voltage detector and the frequency detector.

For example, as shown in FIG. 20, when the specification defines that a power supply voltage is 2.50 V±10%, the range of operation guarantee is 2.25 V to 2.75 V. However, design and evaluation are performed in a range of 2.15 V to 2.85 V with a margin of 0.1 V. Against an attack of causing a malfunction by supplying a voltage outside the range of guarantee and extracting secret information from an output result of the malfunction, a voltage detector to detect a voltage of 2.15 V or less and 2.85 V or more is provided, and if the voltage detector detects a voltage outside the range of guarantee, the voltage detector outputs a reset signal to a CPU. The same countermeasures can be taken for an externally-supplied system clock frequency and operation temperature. Accordingly, countermeasures can be taken against an attack of causing a malfunction under a non-guaranteed operation environment and extracting secret information from an operation result of the malfunction.

However, any of the above-described detectors is designed with an analog circuit, which causes process variations. Thus, in a case where a voltage to be detected on a lower limit side is set to 2.15 V, for example, an upper limit of the distribution is set to 2.15 V by taking process variations into consideration. In this case, when a distribution width of the process variations is 0.1 V, for example, the lower limit of a voltage detected by the voltage detector is 2.05 V. In an LSI used for a security application, the operation thereof needs to be guaranteed for security so that a malfunction does not occur within a voltage range detected by the voltage detector, and thus the LSI needs to be designed so that the LSI normally operates at 2.05 V at the minimum.

When the LSI is designed with a low voltage, one of circuit blocks raising a problem is a nonvolatile memory. When an EEPROM (electronically erasable and programmable read only memory) is used as the nonvolatile memory, a booster is required because the EEPROM requires a high voltage of about a dozen volts in erasing and writing. However, a low power supply voltage causes a large scale of the booster, which leads to an increase in area. Also, if the power supply voltage drops due to refinement of a process generation, a power supply voltage of a peripheral circuit that operates at the voltage also drops accordingly.

For example, as shown in FIG. 21, in a case where a power supply voltage is 1.8 V±10%, the range of voltage guarantee is 1.62 V to 1.98 V. In design of the peripheral circuit, the range of voltage guarantee is set to 1.50 to 2.10 V by taking an operation margin into consideration in order to guarantee an operation in the range of voltage guarantee. When set voltages for the voltage detector are 1.50 V and 2.10 V and when a variation of the voltage detector is 0.1 V, a voltage to be detected by the detector on a lower limit side is 1.4 V. In this case, the peripheral circuit using this voltage as power needs to operate at 1.4 V, which is the lower limit of voltage detection.

SUMMARY OF THE INVENTION

However, when an EEPROM is used as a nonvolatile memory to store security information such as an encryption key, design of a booster to generate a high voltage required for erasing and writing and a reference voltage generator (BGR) to control the voltage in the booster cause an increase in area of the booster and so on because a required voltage is generated on the basis of a low voltage if a power supply voltage drops.

On the other hand, during reading, an operation frequency does not change or becomes high even if the power supply voltage drops due to refinement. However, if the power supply voltage is used as a word line voltage, a drop of the power supply voltage causes a decrease in cell current and a required access time is not realized. Therefore, a raised voltage needs to be applied to the word line for reading.

Furthermore, the area of the booster needs to be further increased in order to guarantee the operation to the lower limit of the voltage detector for countermeasures against an attack using malfunction. If the specification of a clock frequency supplied to the LSI is not fixed, an oscillator needs to be provided to supply the clock frequency to the booster. However, in order to obtain an almost constant oscillation frequency to the lower limit of the voltage detector, a countermeasure circuit needs to be added to the oscillator, which causes the oscillator to be larger.

Furthermore, it is difficult to suppress variations in a temperature detector. If an operation is to be guaranteed within a temperature range according to the specification together with variations in the temperature detector, an increase in area occurs on a high-temperature side where a current value is small, whereas it becomes difficult to satisfy the specification of a consumption current on a low-temperature side where a current value is large.

The present invention has been made in view of the above-described problems according to the known art, and is directed to providing a nonvolatile memory system and a method for controlling a nonvolatile memory, capable of prohibiting a reading operation to a nonvolatile memory by a power supply voltage outside the range of operation guarantee while considering a design margin and preventing an increase in scale of a drive voltage generator (booster).

According to an embodiment of the present invention, there is provided a nonvolatile memory system including a drive voltage generator configured to generate a drive voltage on the basis of a power supply voltage; a plurality of normal memory cells serving as a nonvolatile memory storing data by accumulating charge of a polarity according to the data to be stored in a floating gate at a level according to the drive voltage generated by the drive voltage generator, the data being written in or read from the nonvolatile memory; a minimum voltage detecting memory cell serving as a nonvolatile memory in which charge of a level to cause a read error when the power supply voltage is equal to or lower than a minimum voltage of predetermined operation guarantee is accumulated in a floating gate; and a controller configured to output a read result of the normal memory cells if no read error occurs in a reading operation in the minimum voltage detecting memory cell.

According to another embodiment of the present invention, there is provided a memory control method for performing a reading operation of a plurality of normal memory cells serving as a nonvolatile memory storing data by accumulating charge of a polarity according to the data to be stored in a floating gate at a level according to a drive voltage generated by a drive voltage generator. The memory control method includes the steps of (1) performing a reading operation of a minimum voltage detecting memory cell serving as a nonvolatile memory in which charge of a level to cause a read error when a power supply voltage is equal to or lower than a minimum voltage of predetermined operation guarantee is accumulated in a floating gate; (2) determining whether a read error has occurred in the reading operation of the minimum voltage detecting memory cell; and (3) outputting a read result of the normal memory cells if the determining step determines that no read error has occurred.

According to the embodiments of the present invention, a nonvolatile memory system and a method for controlling a nonvolatile memory, capable of prohibiting a reading operation to a nonvolatile memory by a power supply voltage outside the range of operation guarantee can be provided while considering a design margin and preventing an increase in scale of a drive voltage generator (booster).

BRIEF DESCRIPTION OF THE DRAWINGS

FIGS. 19A to 19C illustrate a case where the present invention is applied to the 3TrNAND-type nonvolatile memory, in which FIG. 19A illustrates erasing, FIG. 19B illustrates writing, and FIG. 19C illustrates reading;

FIG. 20 illustrates a case where the specification of a power supply voltage is 2.50 V±10%; and FIG. 21 illustrates a case where the specification of a power supply voltage is 1.80 V±10%.

DESCRIPTION OF THE PREFERRED EMBODIMENTS

Hereinafter, a nonvolatile memory system according to an embodiment of the present invention is described.

First, a correspondence between elements of this embodiment and elements of the present invention is described.

A normal memory cell MC is an example of a normal memory cell of the present invention. A detecting memory cell DMC0 is an example of a minimum voltage detecting memory cell of the present invention. A detecting memory cell DMC1 is an example of a maximum voltage detecting memory cell of the present invention.

A booster 8 is an example of a drive voltage generator of the present invention.

A bit controller 22 and a CPU 36 are an example of a controller of the present invention.

Figure 1:
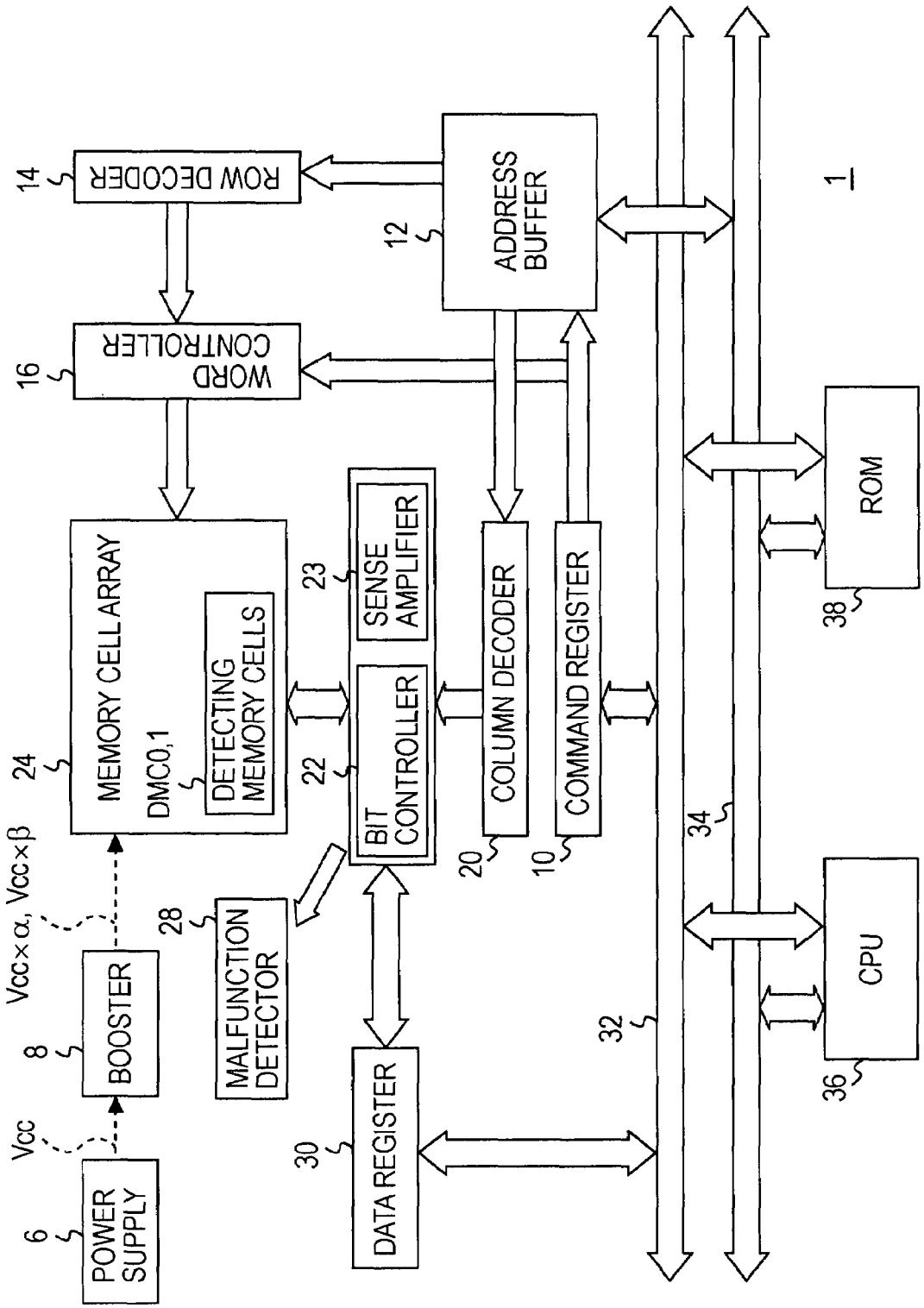
FIG. 1 shows an entire configuration of a nonvolatile memory system according to an embodiment of the present invention.

FIG. 1 shows an entire configuration of a nonvolatile memory system 1 according to the embodiment of the present invention.

As shown in FIG. 1, the nonvolatile memory system 1 includes a power supply 6, the booster 8, a command register 10, an address buffer 12, a row decoder 14, a word controller 16, a column decoder 20, a bit controller 22, a sense amplifier 23, a memory cell array 24, a malfunction detector 28, a data register 30, a CPU (central processing unit) 36, and a ROM (read only memory) 38.

The power supply 6 supplies a power supply voltage Vcc to each circuit in the nonvolatile memory system 1. In this embodiment, the power supply voltage Vcc is 1.80 V, for example.

The booster 8 multiplies the power supply voltage Vcc supplied from the power supply 6 by $\alpha$ in order to generate a voltage $\alpha \times$Vcc and supplies the voltage to the memory cell array 24. In this embodiment, the voltage $\alpha \times$Vcc is 20 V, for example.

Also, the booster 8 multiplies the power supply voltage Vcc supplied from the power supply 6 by $\beta$ in order to generate a voltage $\beta \times$Vcc and supplies the voltage to the memory cell array 24. In this embodiment, the voltage $\beta \times$Vcc is 5 V, for example.

The command register 10 stores commands about access to the memory cell array 24. The commands are written by the CPU 36 via a data bus 32.

The address buffer 12 outputs a row address to the raw decoder 14 and outputs a column address to the column decoder 20, among addresses of the commands stored in the command register 10.

The row decoder 14 decodes a row address received from the address buffer 12 and outputs the decoded address to the word controller 16.

The word controller 16 activates a word line of a memory cell to be accessed (target memory cell) in the memory cell array 24 on the basis of the decoded address received from the row decoder 14.

The column decoder 20 decodes a column address received from the address buffer 12 and outputs the decoded address to the sense amplifier 23.

The bit controller 22 activates a bit line of a target memory cell in the memory cell array 24 on the basis of the decoded address received from the column decoder 20.

The bit line corresponding to the target memory cell is brought into a charge state of a floating gate FG of the target memory cell at reading in the target memory cell, that is, brought into a potential corresponding to whether which of "0" and "1" is stored.

The sense amplifier 23 detects the potential of the bit line corresponding to the target memory cell.

The memory cell array 24 includes a plurality of memory cells arranged in a matrix pattern.

Figure 2:
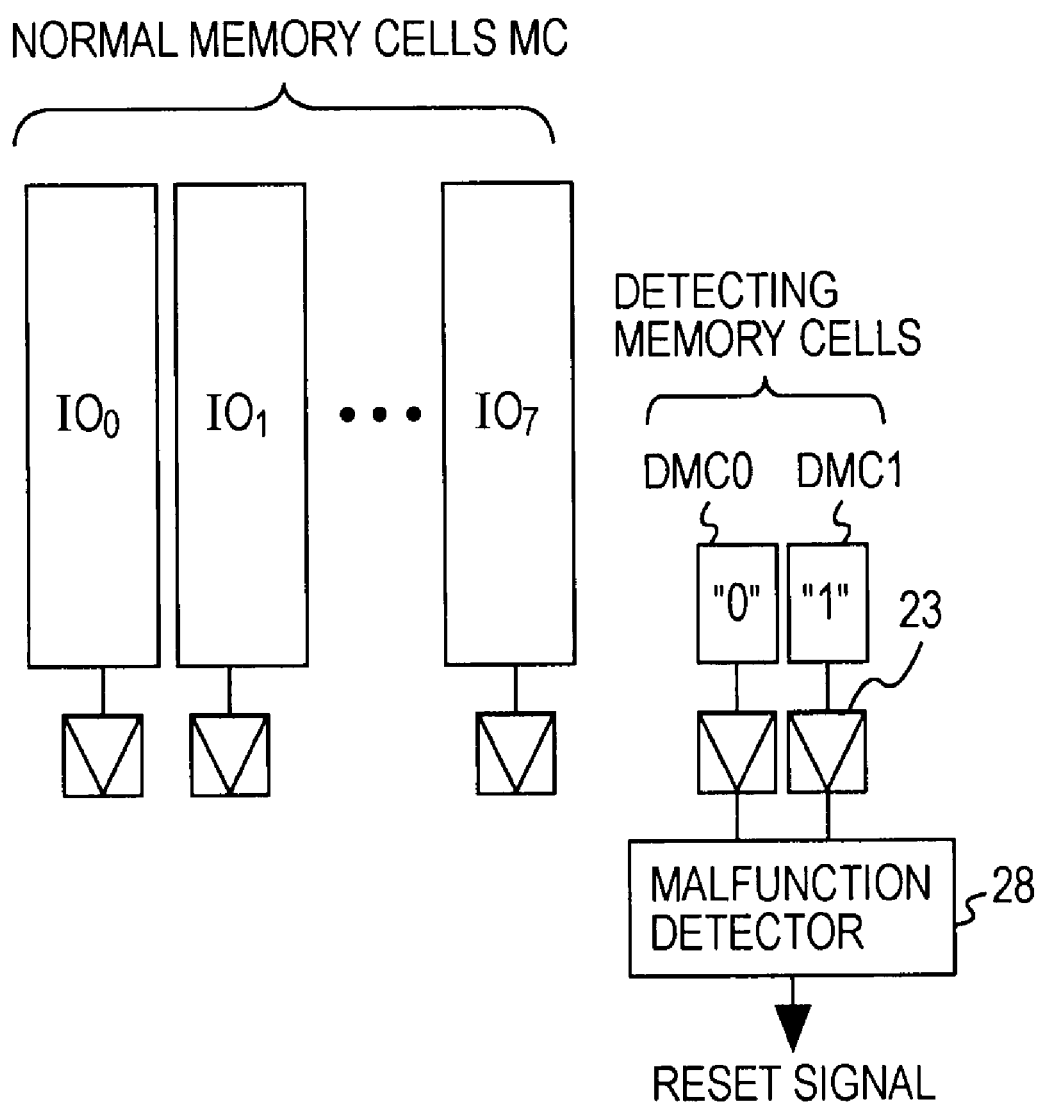
FIG. 2 illustrates normal memory cells MC and detecting memory cells DMC0 and DMC1 shown in FIG. 1.

As shown in FIG. 2, the memory cell array 24 includes normal memory cells MC and detecting memory cells DMC.

The normal memory cells MC are target memory cells of a writing or reading operation.

As shown in FIG. 2, the detecting memory cells DMC include a detecting memory cell DMC1 in which "1" is stored before shipment of the nonvolatile memory system 1 and a detecting memory cell DMC0 in which "0" is stored before the shipment.

In this embodiment, electrons of a smaller number than that in a case of writing "1" in a normal memory cell are injected to the detecting memory cell DMC1 before shipment so that a read result is "1" (normal operation) when the power supply voltage Vcc is equal to or lower than the maximum voltage Vcc (max) and that a read result is "0" (malfunction) when the power supply voltage Vcc is higher than the maximum voltage Vcc (max).

In this embodiment, electrons of a smaller number than that in a case of writing "0" in a normal memory cell are emitted from the detecting memory cell DMC0 before shipment so that a read result is "0" (normal operation) when the power supply voltage Vcc is equal to or higher than the minimum voltage Vcc (min) and that a read result is "1" (malfunction) when the power supply voltage Vcc is lower than the minimum voltage Vcc (min).

Hereinafter, storage in the memory cells is described.

<Operation of Writing "1" in the Normal Memory Cell MC>

Figure 3:
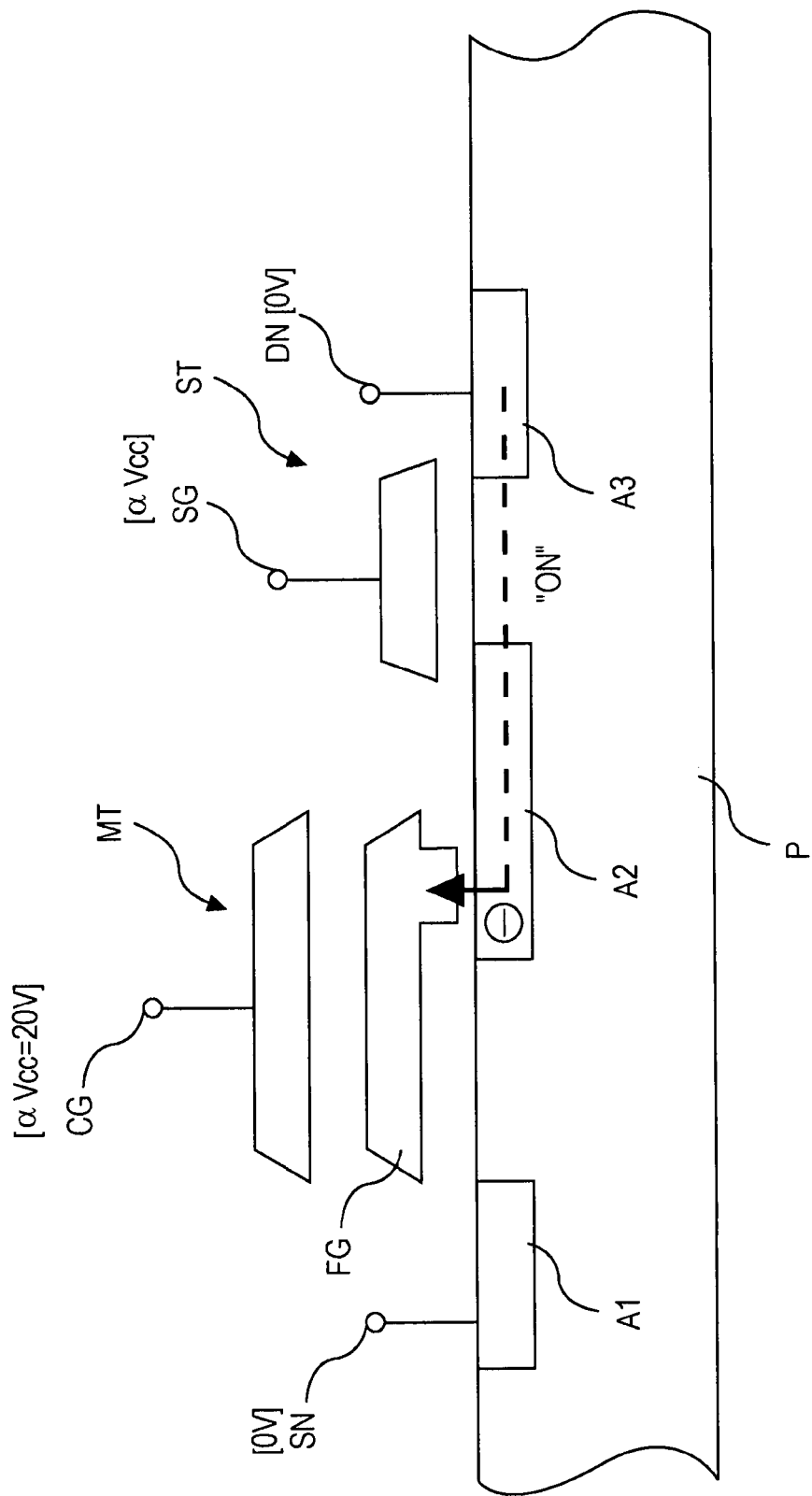
FIG. 3 illustrates an operation of writing "1" in the normal memory cell MC.
Figure 4:
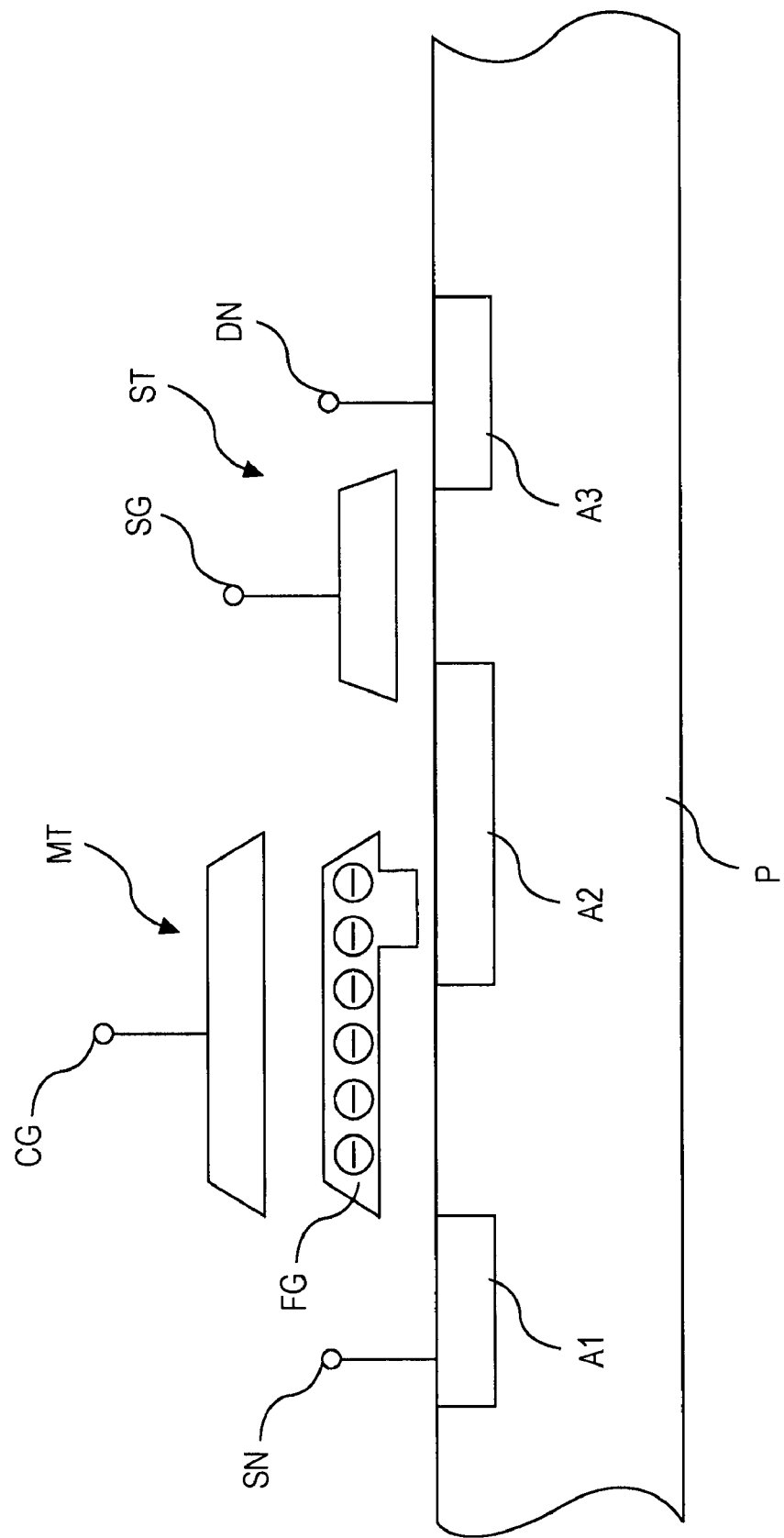
FIG. 4 illustrates a state where "1" is stored in the normal memory cell MC.

FIG. 3 illustrates an operation of writing "1" in the normal memory cell MC.

As shown in FIG. 3, the normal memory cell MC includes a memory transistor MT and a selection transistor ST placed on a substrate P.

The voltage $\alpha \times$Vcc supplied from the booster 8 is applied to a selection gate SG of the selection transistor ST under control by the word controller 16 shown in FIG. 1. Accordingly, the selection transistor ST is brought into an ON state (conduction between the drain and source is established).

A drain electrode DN of the selection transistor ST is kept at 0 V under control by the bit controller 22.

The voltage $\alpha \times$Vcc supplied from the booster 8 is applied to a control gate CG of the memory transistor MT under control by the word controller 16.

Accordingly, as shown in FIG. 3, electrons are injected to a floating gate FG from a diffusion layer (drain) A3 of the selection transistor ST via a diffusion layer A2 from a tunnel portion.

Every time electrons are injected to the floating gate FG, a level of the electrons injected to the floating gate FG is verified. When it is determined that the level is sufficient (a sufficient erasing level has been obtained), the operation of writing "1" ends.

<Operation of Reading "1" from the Normal Memory Cell MC>

Figure 5:
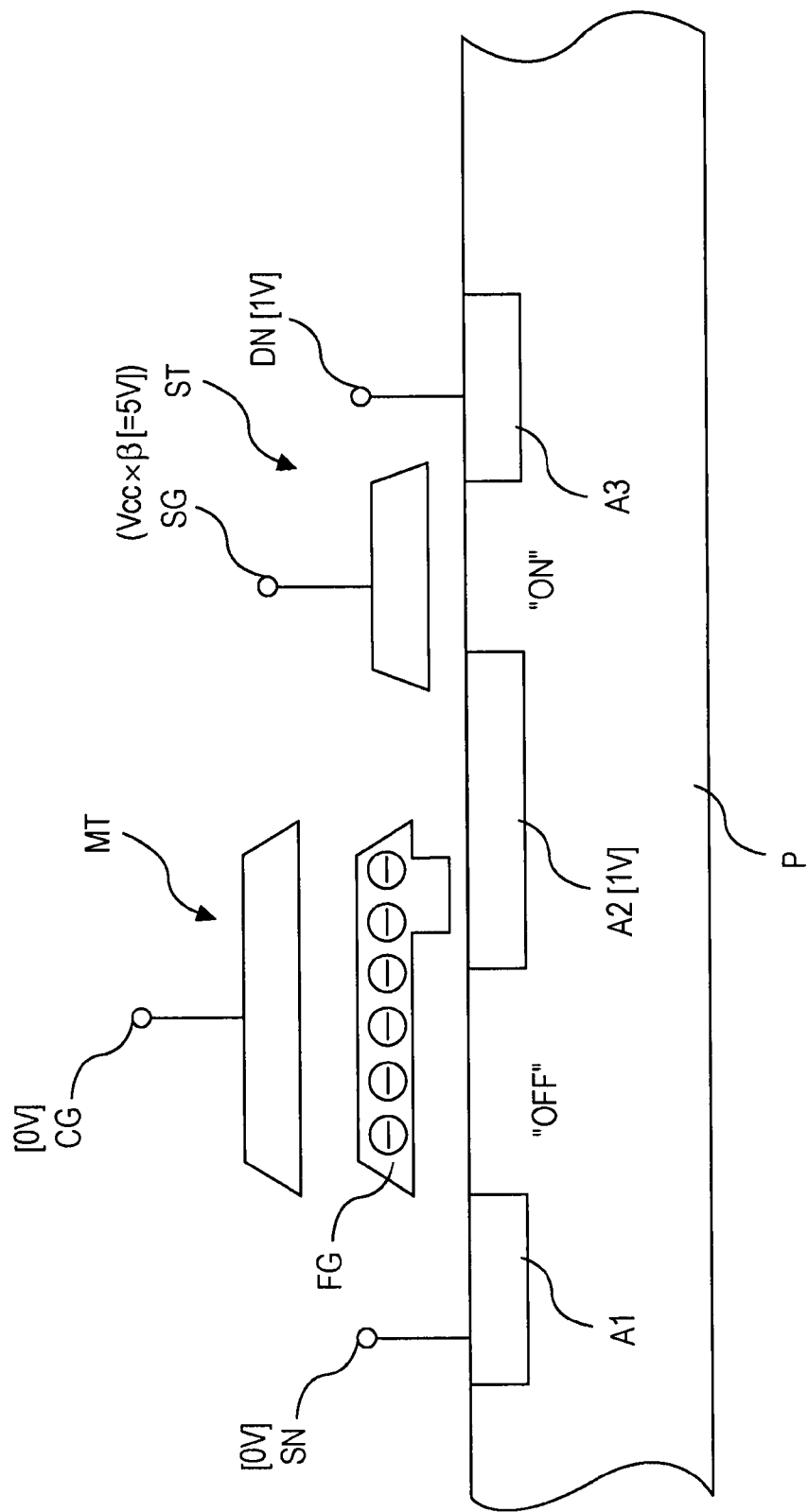
FIG. 5 illustrates an operation of reading "1" from the normal memory cell MC.

FIG. 5 illustrates an operation of reading "1" from the normal memory cell MC.

As shown in FIG. 5, the voltage $\beta \times$Vcc supplied from the booster 8 is applied to the selection gate SG of the selection transistor ST under control by the word controller 16 shown in FIG. 1. Accordingly, the selection transistor ST is brought into an ON state as shown in FIG. 5.

On the other hand, since a sufficient amount of electrons have been injected to the floating gate FG of the memory transistor MT, the memory transistor is in an OFF state (conduction between the drain and source is not established).

Accordingly, the drain electrode DN maintains 1 V of a pull-up level.

That is, when "1" is stored in the normal memory cell MC, the memory transistor MT is in an OFF state, no cell current flows, and the drain electrode DN of the selection transistor ST is at 1 V. If the sense amplifier 23 detects this state, it can be determined that "1" is stored in the normal memory cell MC.

<Operation of Writing "0" in the Normal Memory Cell MC>

Figure 6:
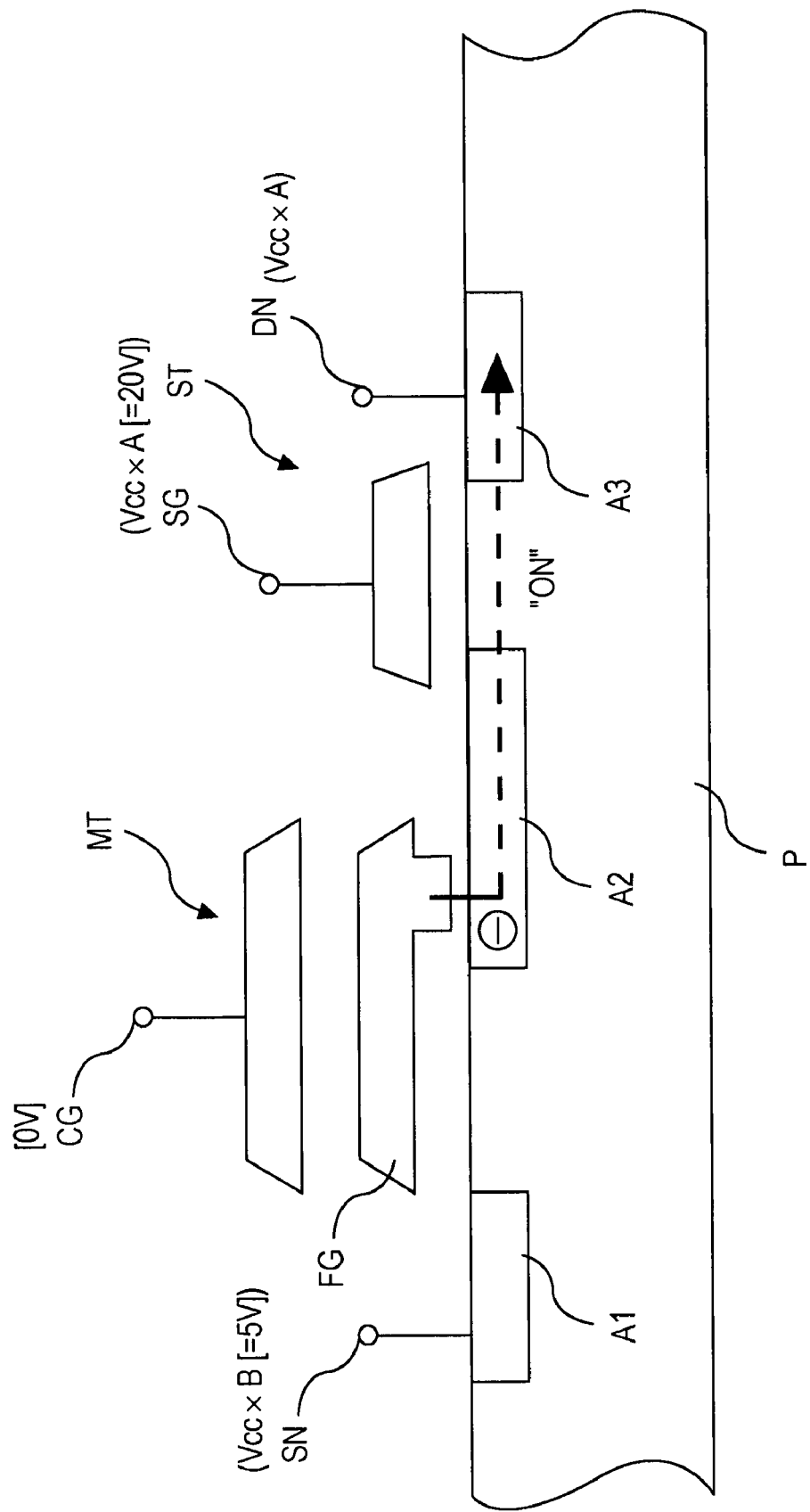
FIG. 6 illustrates an operation of writing "0" in the normal memory cell MC.

FIG. 6 illustrates an operation of writing "0" in the normal memory cell MC.

The voltage $\alpha \times$Vcc supplied from the booster 8 is applied to the selection gate SG of the selection transistor ST under control by the word controller 16 shown in FIG. 1. Accordingly, the selection transistor ST is brought into an ON state (conduction between the drain and source is established).

Also, the voltage α×Vcc supplied from the booster 8 is applied to the drain electrode DN of the selection transistor ST under control by the bit controller 22.

The control gate CG of the memory transistor MT is kept at 0 V under control by the word controller 16.

Accordingly, as shown in FIG. 6, the electrons in the floating gate FT of the memory transistor MT are emitted to the diffusion layer A3 via the tunnel portion and the diffusion layer A2.

Every time the electrons are emitted from the floating gate FG, a level of the electrons emitted from the floating gate FG is verified. When it is determined that the level is sufficient (a sufficient erasing level has been obtained), the operation of writing "0" ends.

<Operation of Reading "0" from the Normal Memory Cell MC>

Figure 8:
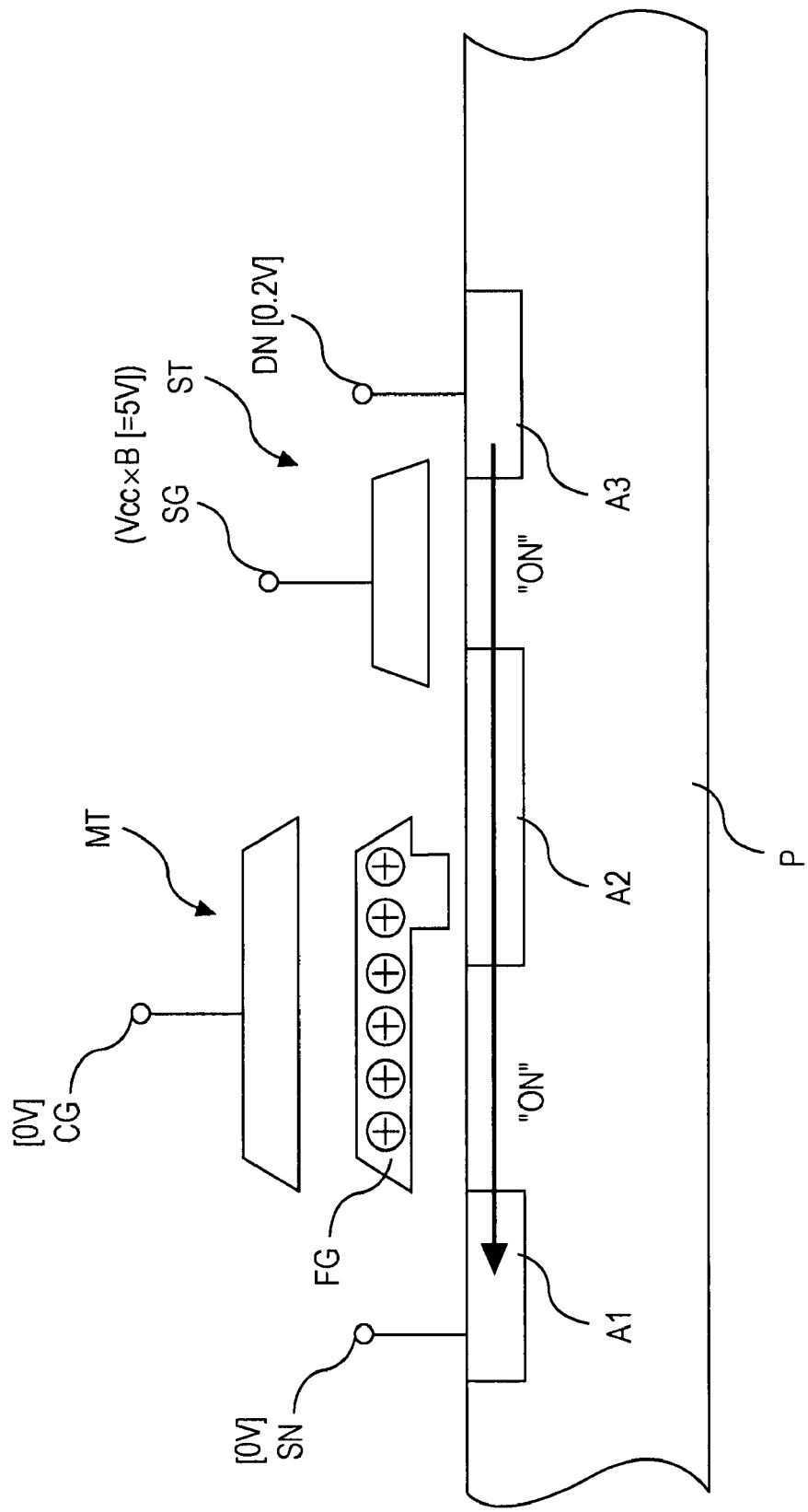
FIG. 8 illustrates an operation of reading "0" from the normal memory cell MC.

FIG. 8 illustrates an operation of reading "0" from the normal memory cell MC.

As shown in FIG. 8, the voltage β×Vcc supplied from the booster 8 is applied to the selection gate SG of the selection transistor ST under control by the word controller 16 shown in FIG. 1. Accordingly, the selection transistor ST is brought into an ON state as shown in FIG. 8.

Since a sufficient amount of electrons have been emitted from the floating gate FG of the memory transistor MT, the memory transistor MT is in a depression type and is in an ON state.

Accordingly, a cell current flows from the diffusion layer A3 toward the diffusion layer A1 via the diffusion layer A2. The cell current causes a drop in voltage, so that the voltage of the drain electrode DN of the selection transistor ST becomes low, that is, about 0.2 V.

That is, when "0" is stored in the normal memory cell MC, the memory transistor MT is in an ON state, a cell current flows, and the drain electrode DN of the selection transistor ST is at 0.2 V. If the sense amplifier 23 detects this state, it can be determined that "0" is stored in the normal memory cell MC.

Hereinafter, a writing operation performed on the detecting memory cells DMC1 and DMC0 before shipment of the nonvolatile memory system 1 is described.

<Write of "1" in the Detecting Memory Cell DMC1>

Figure 9:
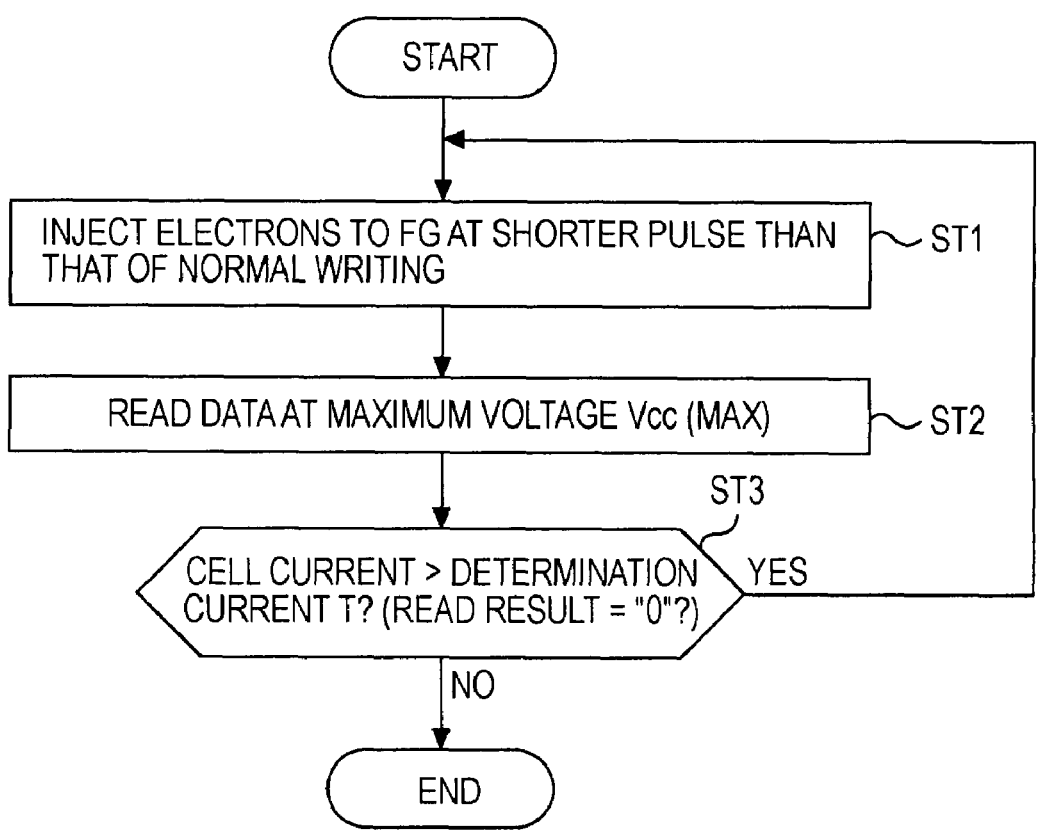
FIG. 9 is a flowchart illustrating an operation of writing "1" in the detecting memory cell DMC1 performed before shipment.

FIG. 9 illustrates an operation of writing "1" in the detecting memory cell DMC1.

This operation is performed by, for example, a memory tester or a logic tester to perform a shipment determination.

Step ST1:

As in the operation of writing "1" in the normal memory cell MC described above with reference to FIG. 3, electrons are injected to the floating gate FG of the memory transistor MT of the detecting memory cell DMC1.

At this time, each injection of electrons into the floating gate FG is performed in a shorter time (shorter pulse) than in write of "1" in the normal memory cell MC. That is, a small amount of electrons are injected repeatedly.

After injection of electrons to the floating gate FG of a predetermined time ends, the process proceeds to step ST2.

Step ST2:

A maximum voltage Vcc (max) that is set under consideration of a design margin is supplied from the power supply 6 or another power supply to the memory cell array 24. The maximum voltage Vcc (max) is set with high accuracy.

Then, data is read from the detecting memory cell DMC1 in the same manner as described above with reference to FIG. 5. The malfunction detector 28 determines whether the read result is "0" or "1" on the basis of a detection result generated by the sense amplifier 23.

Step ST3:

If the malfunction detector 28 determines that the read result obtained in step ST2 is "1", that is, if "cell current<predetermined determination current" is satisfied, the process ends.

On the other hand, if the malfunction detector 28 determines that the read result obtained in step ST2 is "0", the process returns to step ST1.

Figure 10:
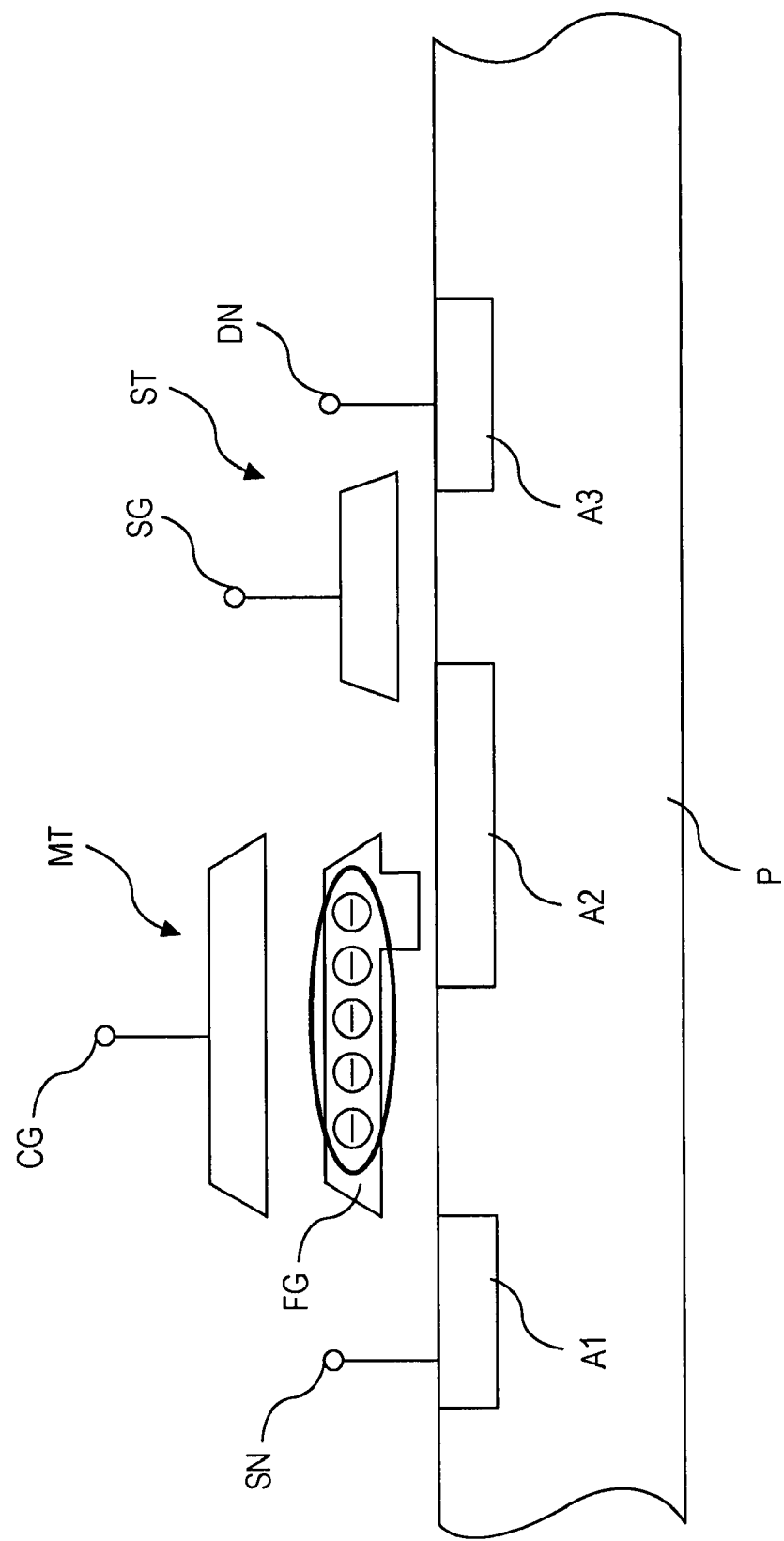
FIG. 10 illustrates a state where "1" is stored in the detecting memory cell DMC1.

That is, electrons are injected to the floating gate FG of the memory transistor MT. The amount of the injected electrons is smaller than that in the write of "1" in the normal memory cell MC shown in FIG. 5, as shown in FIG. 10.

Figure 11:
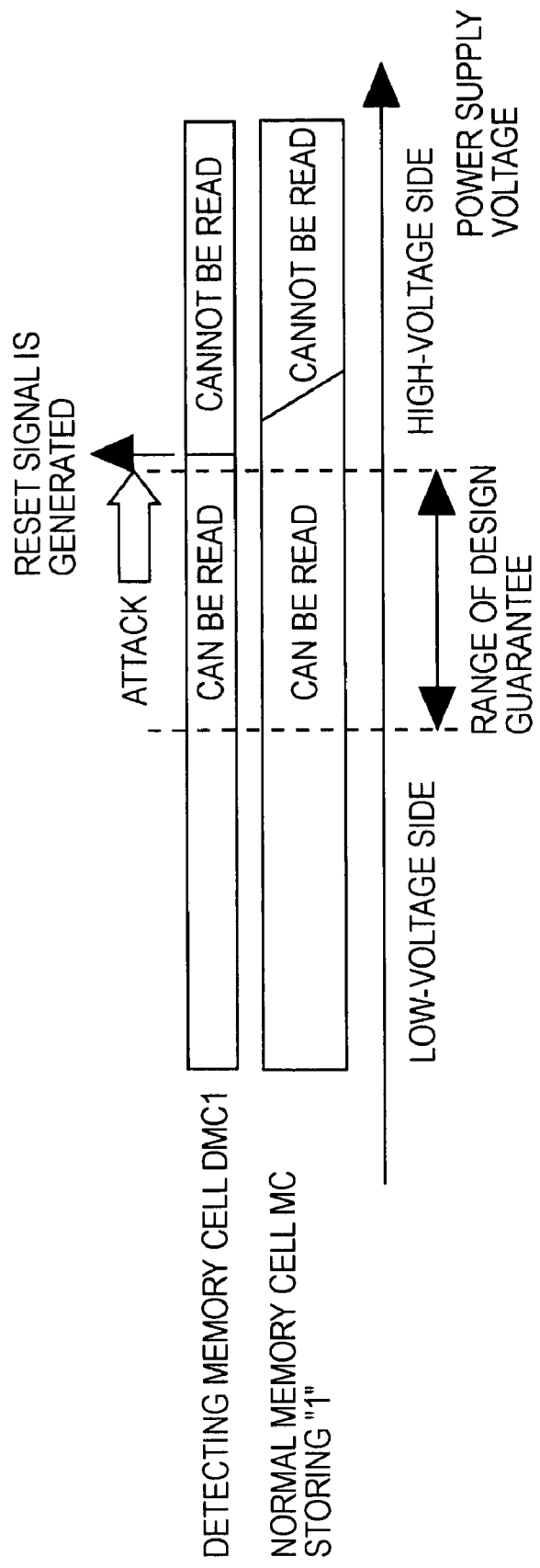
FIG. 11 illustrates an attack to data "1" in the nonvolatile memory system shown in FIG. 1.

After shipment of the nonvolatile memory system 1, if the power supply voltage Vcc of the power supply 6 rises to exceed the maximum voltage Vcc (max), a read result in the detecting memory cell DMC1 is "0" and the malfunction detector 28 detects a malfunction, as shown in FIG. 11, although improper reading does not occur in the normal memory cell MC.

Accordingly, the malfunction detector 28 outputs a reset signal R to the CPU 36, which starts a reset operation.

Figure 12:
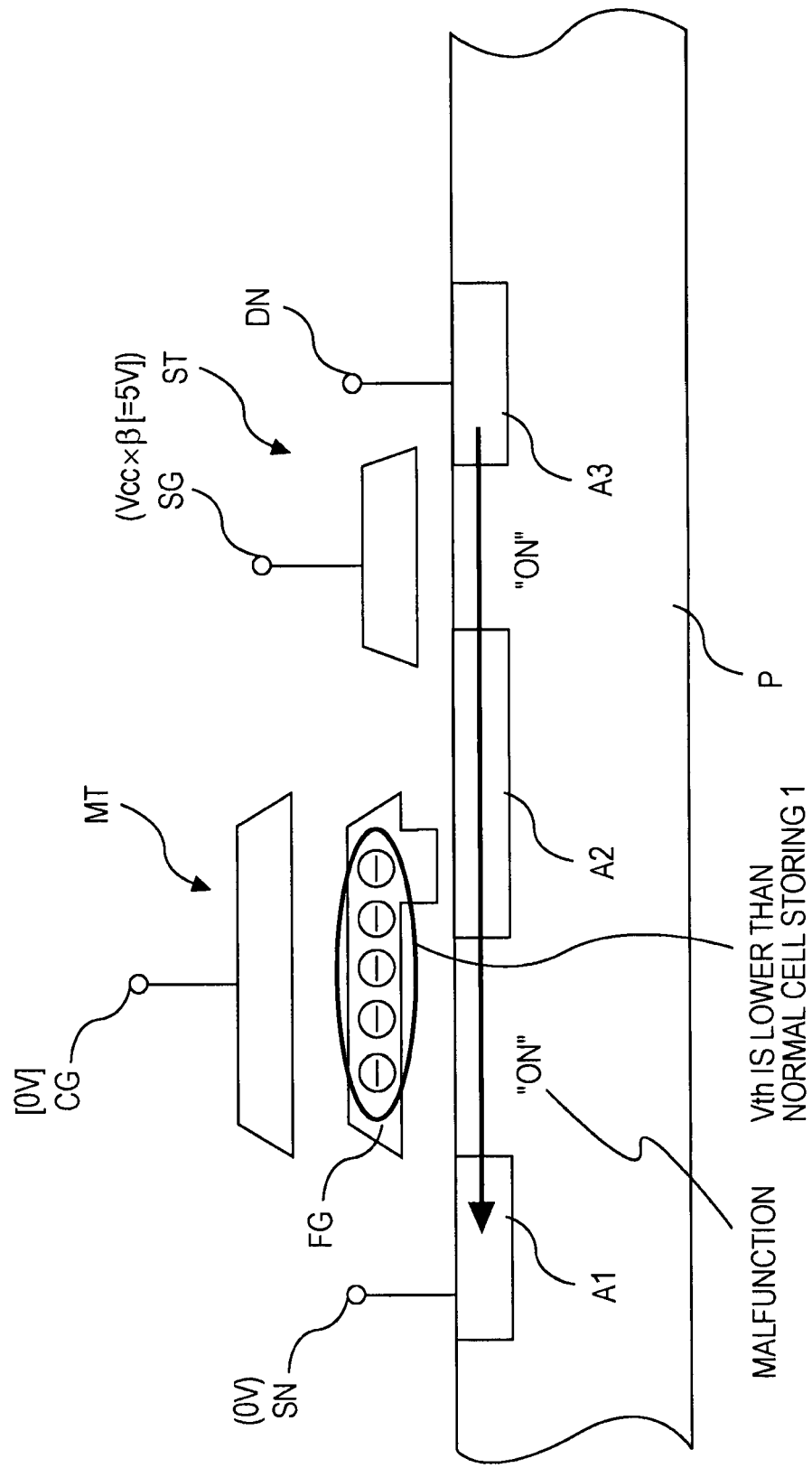
FIG. 12 illustrates a reading operation of the detecting memory cell DMC1 in a case where a power supply voltage exceeds a maximum voltage.

A cause of improper reading in the detecting memory cell DMC1 is that, as shown in FIG. 12, the amount of electrons injected to the floating gate FG of the detecting memory cell DMC1 is smaller than the amount of electrons injected to the floating gate FG of the normal memory cell MC storing "1". That is, in the detecting memory cell DMC1, a threshold of the memory transistor MT is lower than that in the normal memory cell MC storing "1". If a rise in the power supply voltage Vcc causes a rise in the potential of the diffusion layer A2 shown in FIG. 12, the memory transistor MT of the detecting memory cell DMC1 is brought into an ON state first and the cell current thereof exceeds a determination current. However, the amount of the cell current is set to the limit where "1" is read at the maximum voltage Vcc (max).

<Write of "0" in the Detecting Memory Cell DMC0>

Figure 13:
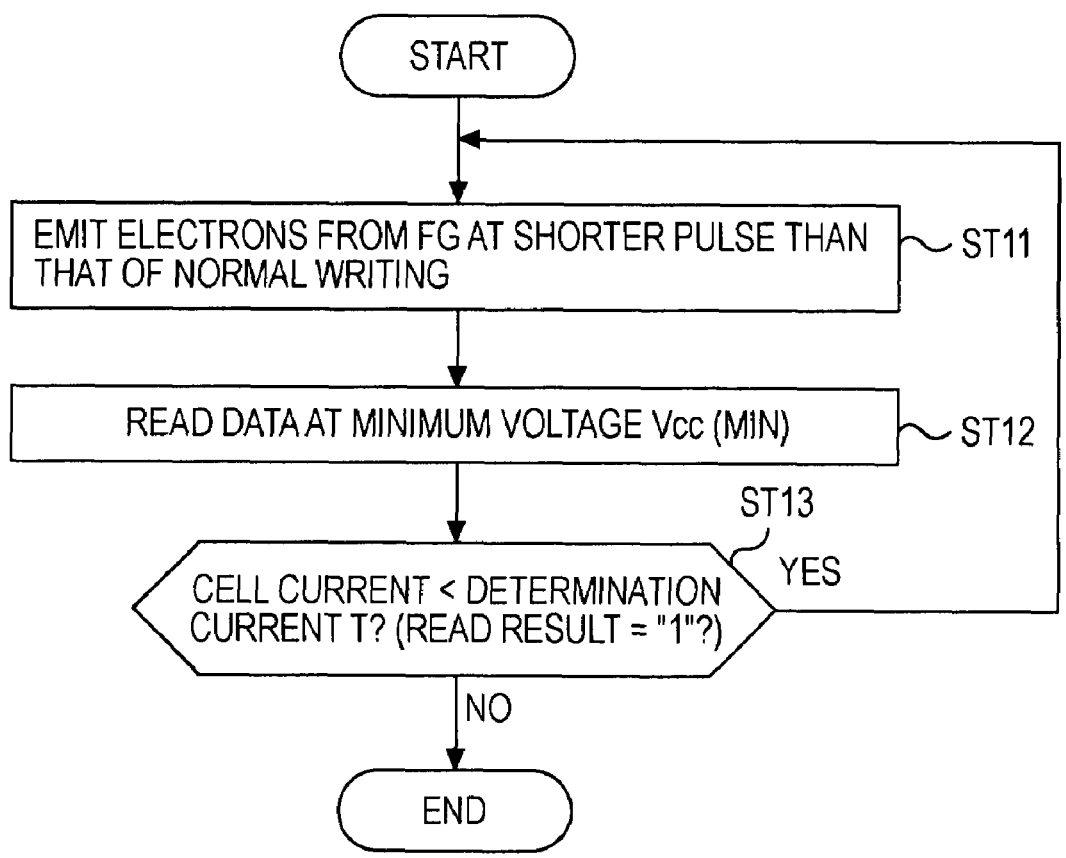
FIG. 13 is a flowchart illustrating an operation of writing "0" in the detecting memory cell DMC0 performed before shipment.

FIG. 13 illustrates an operation of writing "0" in the detecting memory cell DMC0.

This operation is performed by, for example, a memory tester or a logic tester to perform a shipment determination.

Step ST11:

As in the operation of writing "0" in the normal memory cell MC described above with reference to FIG. 6, electrons are emitted from the floating gate FG of the memory transistor MT of the detecting memory cell DMC0.

At this time, each emission of electrons from the floating gate FG is performed in a shorter time (shorter pulse) than in write of "0" in the normal memory cell MC. That is, a small amount of electrons are emitted repeatedly.

After emission of electrons from the floating gate FG of a predetermined time ends, the process proceeds to step ST12.

Step ST12:

A minimum voltage Vcc (min) that is set under consideration of a design margin is supplied from the power supply 6 or another power supply to the memory cell array 24. The minimum voltage Vcc (min) is set with high accuracy.

Then, data is read from the detecting memory cell DMC0 in the same manner as described above with reference to FIG. 8. The malfunction detector 28 determines whether the read result is "0" or "1" on the basis of a detection result generated by the sense amplifier 23.

Step ST13:

If the malfunction detector 28 determines that the read result obtained in step ST12 is "0", that is, if "cell current>predetermined determination current" is satisfied, the process ends.

On the other hand, if the malfunction detector 28 determines that the read result obtained in step ST12 is "1", the process returns to step ST11.

That is, electrons are emitted from the floating gate FG of the memory transistor MT.

Figure 7:
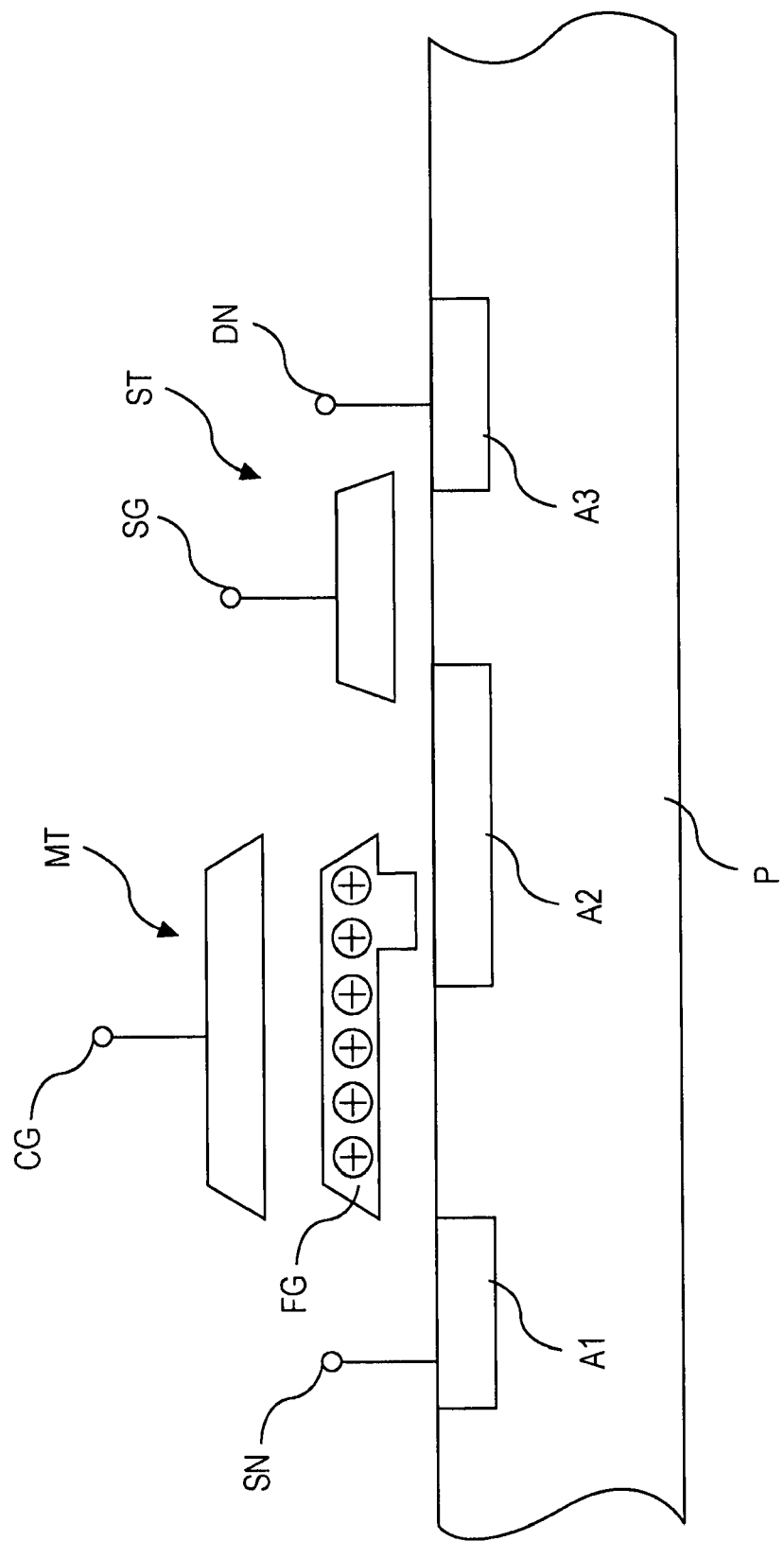
FIG. 7 illustrates a state where "0" is stored in the normal memory cell MC.
Figure 14:
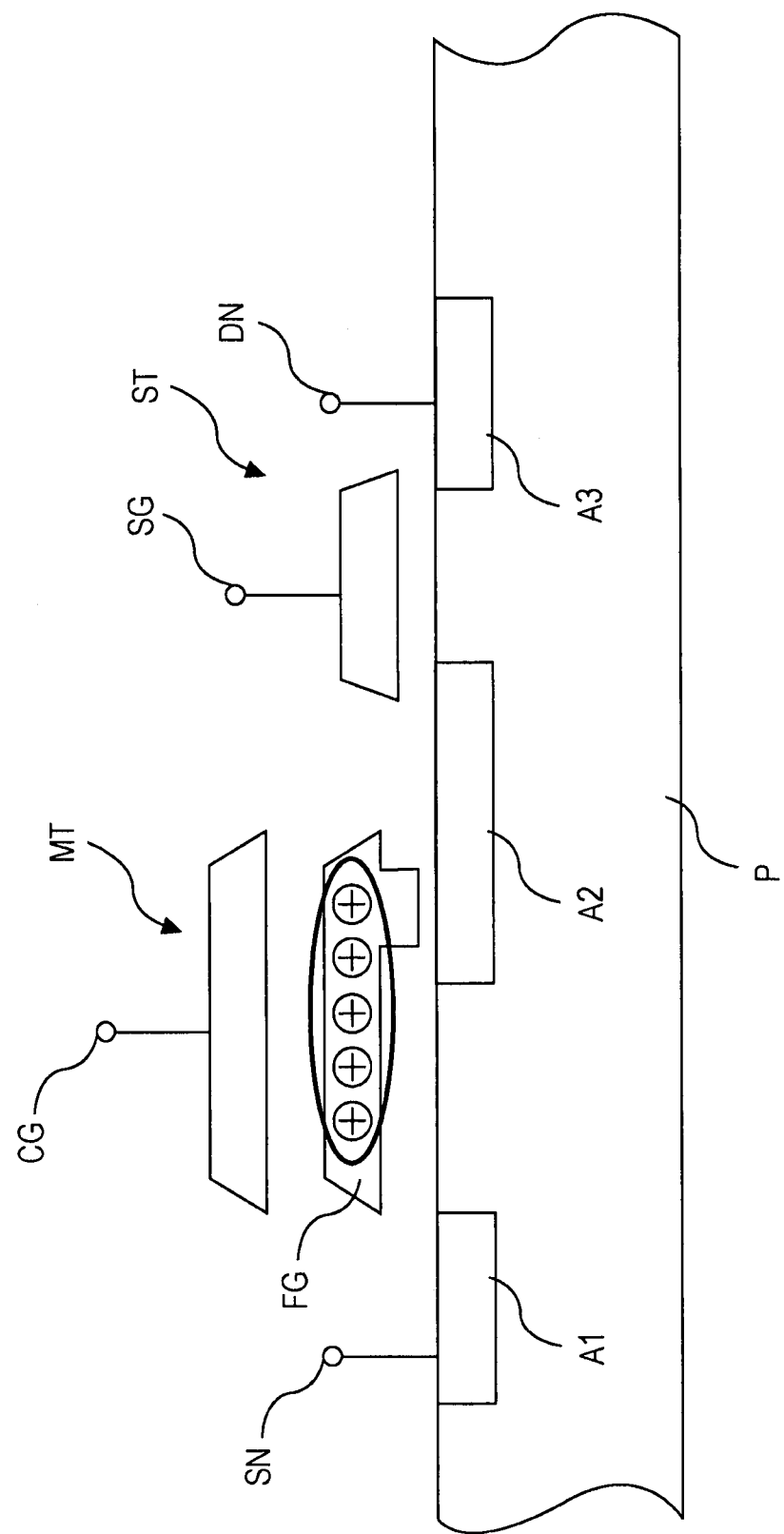
FIG. 14 illustrates a state where "0" is stored in the detecting memory cell DMC0.

As shown in FIG. 14, the amount of positive holes generated by the emitted electrons is smaller than that in write of "0" in the normal memory cell MC shown in FIG. 7.

Figure 15:
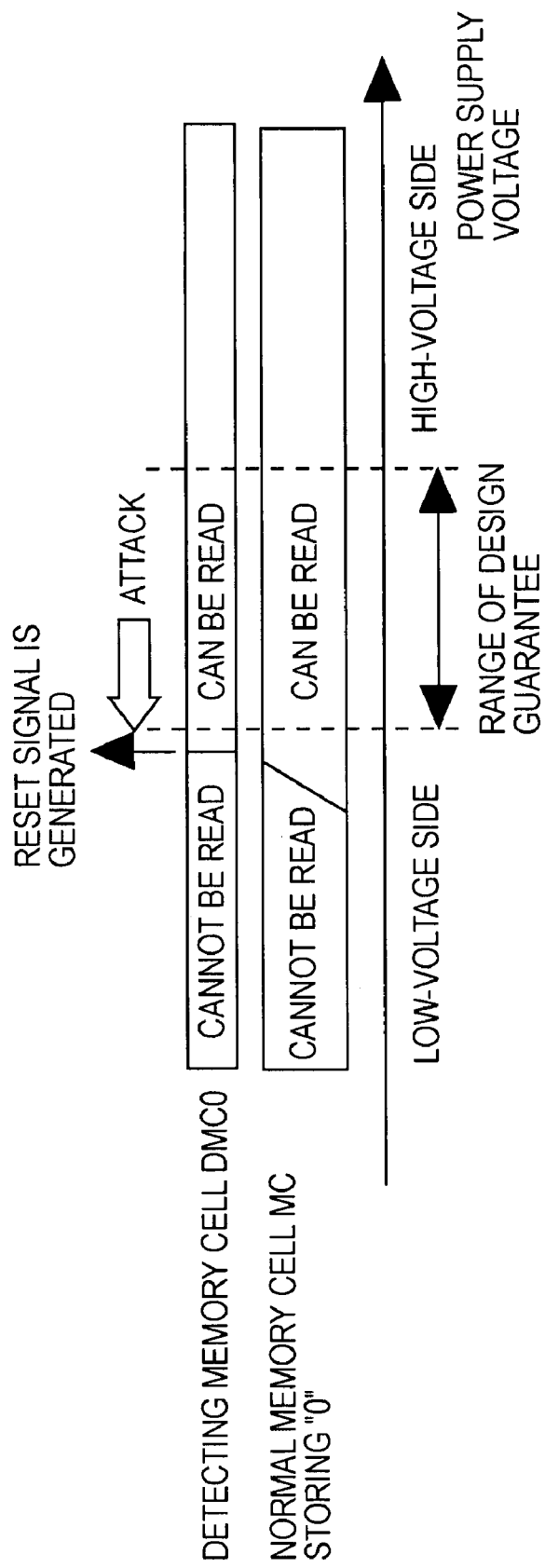
FIG. 15 illustrates an attack to data "0" in the nonvolatile memory system shown in FIG. 1.

After shipment of the nonvolatile memory system 1, if the power supply voltage Vcc of the power supply 6 drops to the minimum voltage Vcc (min) or lower, a read result in the detecting memory cell DMC0 is "1" and the malfunction detector 28 detects a malfunction as shown in FIG. 15, although improper reading does not occur in the normal memory cell MC.

Accordingly, the malfunction detector 28 outputs a reset signal R to the CPU 36, which starts a reset operation.

Figure 16:
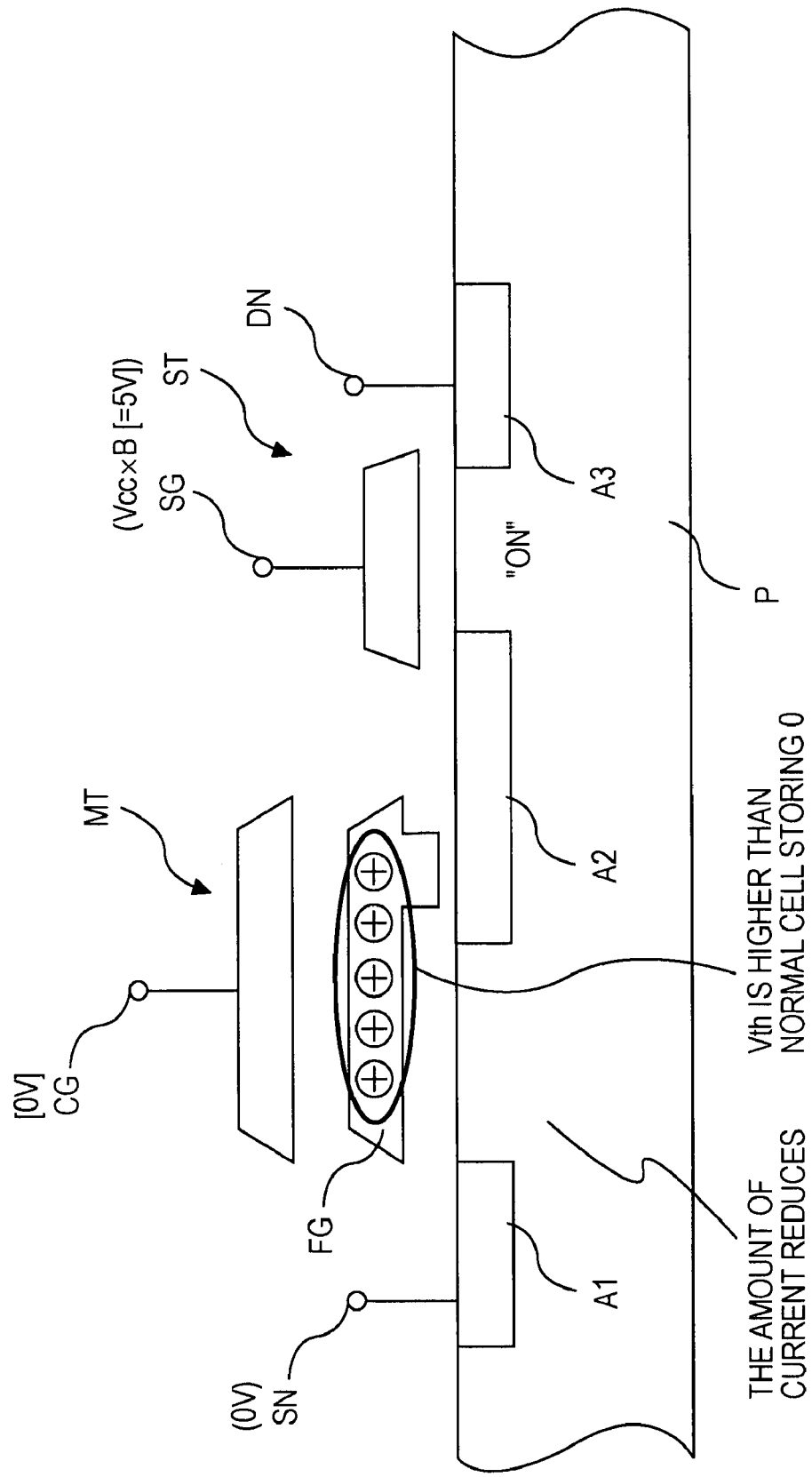
FIG. 16 illustrates a reading operation of the detecting memory cell DMC0 in a case where a power supply voltage is lower than a minimum voltage.

A cause of improper reading in the detecting memory cell DMC0 is that, as shown in FIG. 16, the amount of electrons emitted from the floating gate FG of the detecting memory cell DMC0 is smaller than the amount of electrons emitted from the floating gate FG of the normal memory cell MC storing "0". That is, in the detecting memory cell DMC0, a threshold of the memory transistor MT is higher than that in the normal memory cell MC storing "0". If a drop in the power supply voltage Vcc causes a drop in the potential of the diffusion layer A2 shown in FIG. 12, the cell current flowing through the memory transistor MT of the detecting memory cell DMC0 becomes smaller than the determination current.

<Example of Reading Operation in the Nonvolatile Memory System 1>

Figure 17:
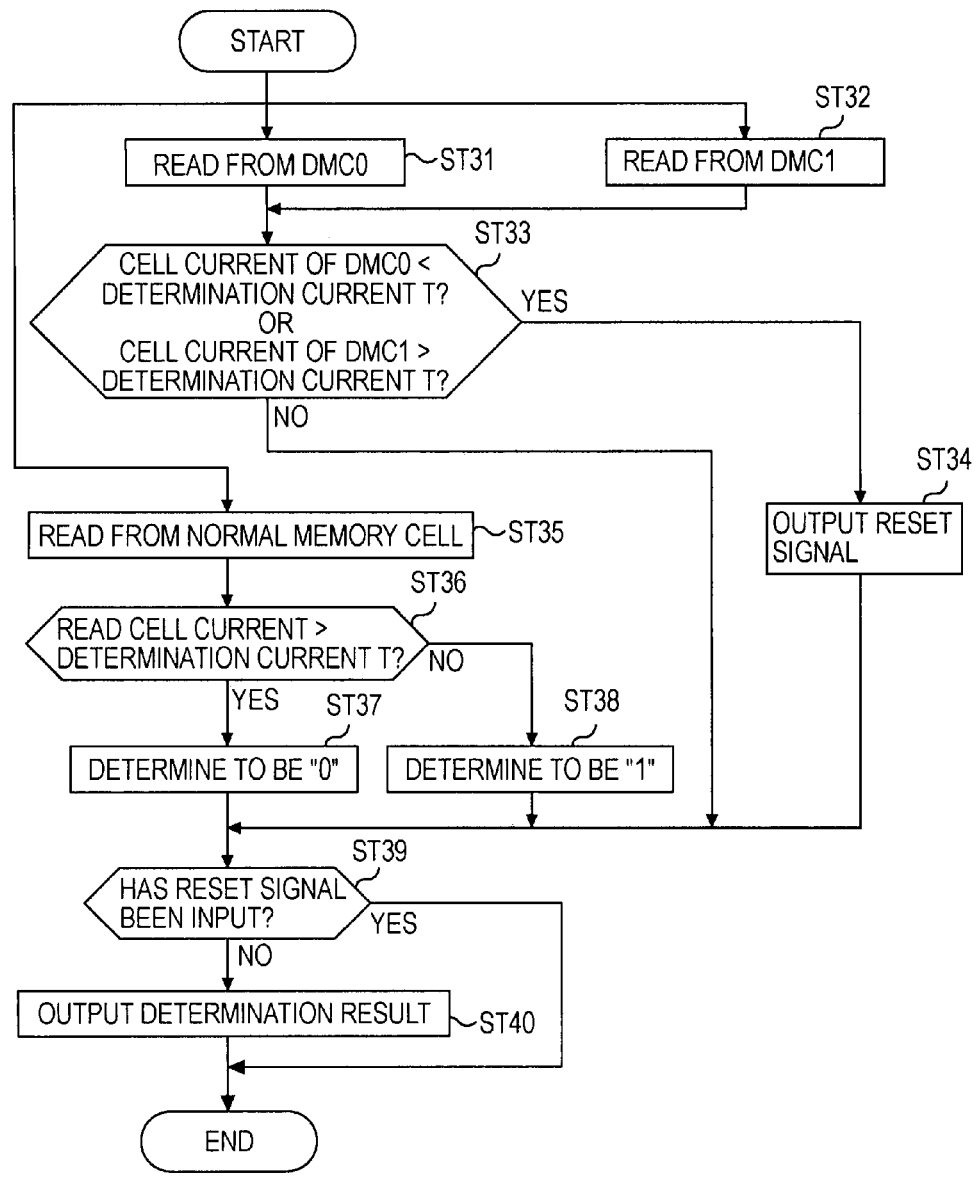
FIG. 17 illustrates a reading operation in the nonvolatile memory system shown in FIG. 1.

FIG. 17 is a flowchart illustrating a reading operation performed in the nonvolatile memory system 1.

Step ST31:

The CPU 36 performs control so as to perform a reading operation from the detecting memory cell DMC0 of the memory cell array 24.

Step ST32:

The CPU 36 performs control so as to perform a reading operation from the detecting memory cell DMC1 of the memory cell array 24.

Steps ST31 and ST32 are performed in parallel.

Step ST33:

The memory transistor MT of the detecting memory cell DMC0 is in an OFF state when the power supply voltage Vcc is equal to or lower than the minimum voltage Vcc (min), no cell current flows, and the voltage of the drain electrode DN of the selection transistor ST becomes higher than a determination voltage. That is, the cell current from the detecting memory cell DMC0 is equal to or smaller than the determination current.

On the other hand, the memory transistor MT of the detecting memory cell DMC0 is in an ON state when the power supply voltage Vcc is higher than the minimum voltage Vcc (min), a cell current flows, and the voltage of the drain electrode DN of the selection transistor ST becomes lower than the determination voltage. That is, the cell current from the detecting memory cell DMC0 is larger than the determination current.

The memory transistor MT of the detecting memory cell DMC1 is in an ON state when the power supply voltage Vcc is equal to or higher than the maximum voltage Vcc (max), a cell current flows, and the voltage of the drain electrode DN of the selection transistor ST becomes lower than the determination voltage. That is, the cell current from the detecting memory cell DMC1 is equal to or larger than the determination current.

On the other hand, the memory transistor MT of the detecting memory cell DMC1 is in an OFF state when the power supply voltage Vcc is lower than the maximum voltage Vcc (max), no cell current flows, and the voltage of the drain electrode DN of the selection transistor ST becomes higher than the determination voltage. That is, the cell current from the detecting memory cell DMC1 is smaller than the determination current.

The malfunction detector 28 determines whether a condition "cell current of DMC0<determination current T" or a condition "cell current of DMC1>determination current T" is satisfied. If any of the conditions is satisfied, the process proceeds to step ST34. Otherwise, the process proceeds to step ST39.

Step ST34:

The malfunction detector 28 outputs a reset signal to the CPU 36.

Step ST35:

The CPU 36 performs control so as to perform a reading operation from the normal memory cell MC of the memory cell array 24.

Step ST35 is performed in parallel with steps ST31 and ST32.

Step ST36:

On the basis of a detection result generated by the sense amplifier 23, if the read cell current is larger than the determination current, the process proceeds to step ST37. Otherwise, the process proceeds to step ST38.

Step ST37:

The CPU 36 determines that a read result of the target normal memory cell MC is "0".

Step ST38:

The CPU 36 determines that a read result of the target normal memory cell MC is "1".

Step ST39:

The CPU 36 determines whether the CPU 36 has received a reset signal from the malfunction detector 28. If the CPU 36 has received a reset signal, the process ends. Otherwise, the process proceeds to step ST40.

Step ST40:

The CPU 36 outputs a determination result obtained in step ST37 or ST38.

As described above, according to the nonvolatile memory system 1, if the power supply voltage Vcc supplied from the power supply 6 is outside the predetermined guaranteed range of normal operation (from the minimum voltage Vcc (min) to the maximum voltage Vcc (max)), that state can be detected by a reading operation from the detecting memory cells DMC0 and DMC1 performed in parallel with a reading operation from the normal memory cell MC. Thus, there is no need to guarantee an operation in a substantially wider range than the above described guaranteed range of normal operation by considering a characteristic variation of a power supply detector, unlike in the known art. Accordingly, the scale of the booster can be reduced.

In the nonvolatile memory system 1, in a case where the specification specifies that the power supply voltage Vcc is 1.8 V±10%, the range of the power supply voltage Vcc is 1.62 V to 1.98 V. However, in a case where the range of the power supply voltage Vcc is set to 1.50 V to 2.10 V under consideration of a margin and where "0" and "1" are written with high accuracy in a memory for detecting a malfunction, if the power supply voltage is reduced to below the minimum voltage 1.50 V for causing improper reading, the cell current of a cell written with data "0" decreases. In this case, however, the cell current is smaller than a determination current in reading of the detecting memory cell DMC0 and "1" is read, so that improper reading is detected and reset is performed.

Also, if an operation temperature is raised, the cell current of a cell written with data "0" decreases. However, the cell current becomes smaller than the determination current in reading of the detecting memory cell DMC0 and "1" is improperly read, so that the improper reading is detected and reset is performed. Accordingly, runaway of the CPU caused by data that is improperly read from the memory cell or malfunction in the encrypting engine using the improperly-read data can be prevented.

On the other hand, if the power supply voltage Vcc is raised to higher than the maximum voltage 2.10 V for causing improper reading, the cell current of a cell written with data "1" increases. However, the cell current becomes larger than the determination current in reading of the detecting memory cell DMC1 and "0" is read, so that improper reading is detected and reset is performed. Also, if an operation temperature is decreased, the cell current of a cell written with data "1" increases. However, the cell current becomes larger than the determination current in reading of the detecting memory cell DMC1 and "0" is improperly read, so that the improper reading is detected and reset is performed.

In circuit design of this configuration, operation check is performed by simulation or design verification after experimental manufacture within a range including the power supply voltage and a design margin. A data writing level in a malfunction detecting EEPROM is set to a level that is slightly lower than a determination level by performing verification reading at a minimum power supply voltage that is set under consideration of a design margin of the power supply voltage. Thus, in an operation within the range of power supply voltage according to the specification, data in the malfunction detecting EEPROM is not read improperly because allowance of the design margin is provided. On the other hand, since the writing level is set to a level that is slightly lower than a determination level by verification reading at the minimum power supply voltage that is set under consideration of a design margin of the power supply voltage, improper reading is caused by a slight drop in voltage from the determination level if the power supply voltage is decreased. Accordingly, a malfunction due to unstable operation of an internal circuit can be prevented. That is, the nonvolatile memory system 1 normally operates on a constant basis until a reset signal is generated when the power supply voltage drops.

Likewise, on the upper side, an erasing level of the detecting memory cell is set to a level that is slightly higher than a determination level by verification reading at the maximum power supply voltage that is set under consideration of a design margin of the power supply voltage. Thus, in an operation within the range of power supply voltage according to the specification, data in the detecting memory cell is not read improperly because allowance of the design margin is provided. On the other hand, since the erasing level is set to a level that is slightly higher than the determination level by verification reading at the maximum power supply voltage that is set under consideration of a design margin of the power supply voltage, improper reading is caused by a slight rise in voltage from the determination level if the power supply voltage is raised. Accordingly, a malfunction due to unstable operation of an internal circuit can be prevented. That is, the nonvolatile memory system 1 normally operates on a constant basis until a reset signal is generated by reading of the detecting memory cell when the power supply voltage is raised.

Accordingly, if an attack is performed, for example, if the power supply voltage is raised/dropped beyond the value specified by the specification or if the operation temperature is increased/decreased beyond the range specified by the specification, improper reading occurs in one of the malfunction detecting memory cells storing "0" or "1" and a reset signal is output to the CPU 36. Accordingly, runaway of the CPU 36 due to improperly-read data and an improper operation due to wrong data in the encrypting engine caused by use of the improperly-read data can be prevented.

If a command of an erasing and writing operation is started, an operation sequence of repeating a short erasing and writing operation and a verification reading for verification is started. The operation sequence is organized so that the sequence starts from the verification reading. Accordingly, if an operation is to be performed under a voltage and temperature outside the range defined by the specification, improper reading occurs in one of the malfunction detecting memory cells storing "0" or "1" in the verification reading at the start of the sequence. Thus, the CPU 36 is reset, so that improper erasing and improper writing in the nonvolatile memory cell can be prevented.

With the above-described configuration, the nonvolatile memory can be designed within a range including the voltage range and the temperature range specified by the specification together with a design margin. There is no need to design the nonvolatile memory while considering a range of a design variation of a circuit to detect an abnormal voltage and an abnormal temperature. If the nonvolatile memory is operated under an operation condition outside the range defined by the specification in order to cause improper reading, writing, or erasing, the EEPROM detects the abnormality and resets the CPU 36, so that occurrence of a malfunction can be prevented.

In design of a nonvolatile memory that is used for a security application and that uses an internally-generated high voltage for erasing and writing operation, the design can be performed within a range of voltage and temperature defined in the specification and a design margin, as in design of a nonvolatile memory used in an application other than security. Accordingly, an increase in area and current consumption of the booster can be suppressed. Furthermore, occurrence of improper reading, improper erasing, and improper writing can be reliably prevented.

The present invention is not limited to the above-described embodiment. It should be understood by those skilled in the art that various modifications, combinations, sub-combinations and alterations may occur depending on design requirements and other factors insofar as they are within the scope of the appended claims or the equivalents thereof.

For example, a nonvolatile memory of a FLOTOX type is described as an example in the above-described embodiment, but the present invention can be applied to other types of nonvolatile memory, such as a 3TrNAND type or an ETOX type.

Figure 18:
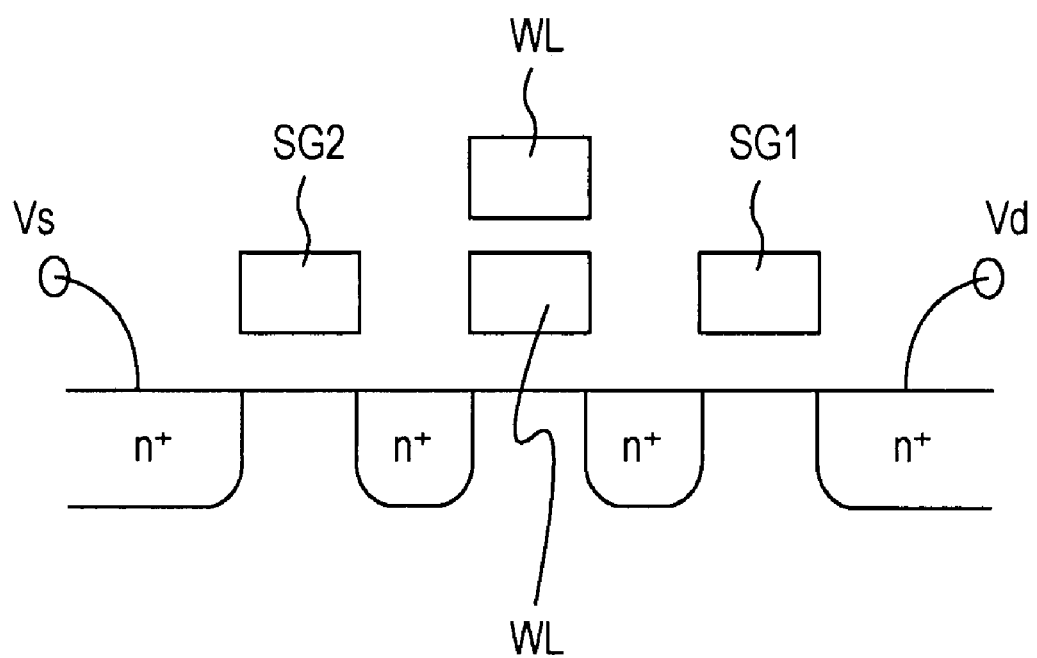
FIG. 18 illustrates a case where the present invention is applied to a 3TrNAND-type nonvolatile memory.

FIG. 18 illustrates a configuration of a memory cell 100 of a 3TrNAND type nonvolatile memory. As shown in FIG. 18, the memory cell 100 includes a memory transistor that is turned ON/OFF by a voltage applied to a word line WL. Also, selection transistors that are turned ON/OFF by voltages applied to selection gates SG1 and SG2, respectively, are provided on both sides of the memory cell 100.

Figure 19A:
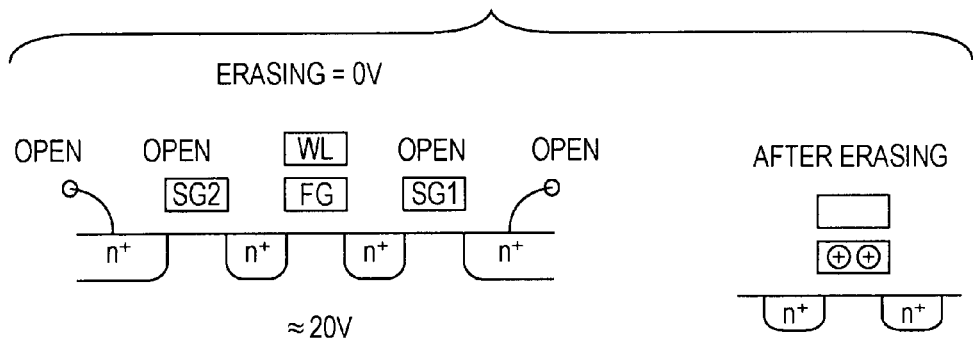

In the memory cell 100, as shown in FIG. 19A, the selection gates SG1 and SG2 are opened and the word line WL is set to 0 V at erasing of data. Accordingly, positive holes are accumulated in the floating gate FG.

Figure 19B:
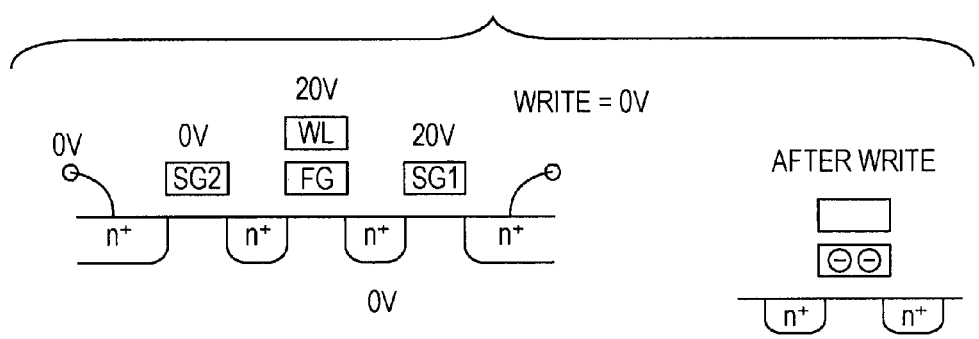

At writing of data, as shown in FIG. 19B, the selection gate SG1 is set to 20 V, the selection gate SG2 is set to 0 V, and a voltage of 20 V is applied to the word line WL. Accordingly, electrons are accumulated in the floating gate FG.

Figure 19C:
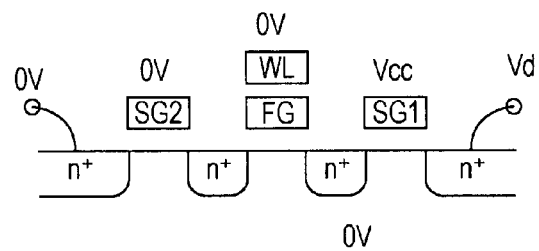

At reading of data, as shown in FIG. 19C, the power supply voltage Vcc is applied to the selection gate SG1, and the selection gate SG2 and the word line WL is set to 0 V.

In the 3TrNAND type nonvolatile memory using the above-described memory cell 100, as in the nonvolatile memory system 1, normal memory cells and detecting memory cells DMC1 and DMC0 are defined as the memory cell 100, electrons of a smaller amount than that in a case of writing "1" in the normal memory cell are injected to the detecting memory cell DMC1, and electrons are emitted from the detecting memory cell DMC0 so that the amount of the emitted electrons is smaller than in a case of writing "0" in the normal memory cell. Accordingly, the same effect as in the nonvolatile memory system 1 can be obtained.

In the above-described example, a storage state of "1" and "0" is indicated by whether any of positive holes or electrons is held in the floating gate (whether the charge state is positive or negative). Alternatively, the storage state of "1" and "0" may be indicated by whether electrons have been injected to the floating gate, as in a DINOR type or the ETOX type.

What is claimed is:

1. A nonvolatile memory system comprising:
   a drive voltage generator configured to generate a drive voltage on the basis of a power supply voltage;
   a plurality of normal memory cells serving as a nonvolatile memory storing data by accumulating charge of a polarity according to the data to be stored in a floating gate at a level according to the drive voltage generated by the drive voltage generator, the data being written in or read from the nonvolatile memory;
   a minimum voltage detecting memory cell serving as a nonvolatile memory in which charge of a level to cause a read error when the power supply voltage is equal to or lower than a minimum voltage of predetermined operation guarantee is accumulated in a floating gate; and
   a controller configured to output a read result of the normal memory cells if no read error occurs in a reading operation in the minimum voltage detecting memory cell.

2. The nonvolatile memory system according to claim 1, further comprising:
   a maximum voltage detecting memory cell serving as a nonvolatile memory in which charge of a level to cause a read error when the power supply voltage is equal to or higher than a maximum voltage of the predetermined operation guarantee is accumulated in the floating gate,
   wherein the controller outputs a read result of the normal memory cells if no read error occurs in a reading operation in both the minimum voltage detecting memory cell and the maximum voltage detecting memory cell.

3. The nonvolatile memory system according to claim 1, wherein a writing operation to the minimum voltage detecting memory cell is prohibited.

4. The nonvolatile memory system according to claim 1, wherein the controller performs a reset operation upon determining that a read error has occurred in a reading operation in the minimum voltage detecting memory cell.

5. The nonvolatile memory system according to claim 1, wherein a positive charge is accumulated in the minimum voltage detecting memory cell.

6. The nonvolatile memory system according to claim 2, wherein a negative charge is accumulated in the maximum voltage detecting memory cell.

7. A memory control method for performing a reading operation of a plurality of normal memory cells serving as a nonvolatile memory storing data by accumulating charge of a polarity according to the data to be stored in a floating gate at a level according to a drive voltage generated by a drive voltage generator, the memory control method comprising the steps of:
   (1) performing a reading operation of a minimum voltage detecting memory cell serving as a nonvolatile memory in which charge of a level to cause a read error when a power supply voltage is equal to or lower than a minimum voltage of predetermined operation guarantee is accumulated in a floating gate;
   (2) determining whether a read error has occurred in the reading operation of the minimum voltage detecting memory cell; and
   (3) outputting a read result of the normal memory cells if the determining step determines that no read error has occurred.

8. The memory control method according to claim 7, further comprising:
   (4) performing a reading operation of a maximum voltage detecting memory cell serving as a nonvolatile memory in which charge of a level to cause a read error when the power supply voltage is equal to or higher than a maximum voltage of the predetermined operation guarantee is accumulated in the floating gate,
   wherein step (3) outputs a read result of the normal memory cells if no read error occurs in steps (2) and (4).

* * * * *